United States Patent
Chuang et al.

(10) Patent No.: US 12,476,207 B2
(45) Date of Patent: Nov. 18, 2025

(54) EMBEDDED MEMORY DEVICE WITH REDUCED PLASMA-INDUCED DAMAGE AND METHODS OF FORMING THE SAME

(71) Applicant: Taiwan Semiconductor Manufacturing Company Limited, Hsinchu (TW)

(72) Inventors: Harry-Hak-Lay Chuang, Zhubei (TW); Hung Cho Wang, Taipei (TW); Wen-Chun You, Dongshan Township (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 400 days.

(21) Appl. No.: 18/303,631

(22) Filed: Apr. 20, 2023

(65) Prior Publication Data
US 2024/0113043 A1  Apr. 4, 2024

Related U.S. Application Data

(60) Provisional application No. 63/411,714, filed on Sep. 30, 2022.

(51) Int. Cl.
| | |
|---|---|
| *H01L 23/60* | (2006.01) |
| *H10B 53/30* | (2023.01) |
| *H10B 61/00* | (2023.01) |
| *H10B 63/00* | (2023.01) |

(52) U.S. Cl.
CPC .............. *H01L 23/60* (2013.01); *H10B 53/30* (2023.02); *H10B 61/00* (2023.02); *H10B 63/80* (2023.02)

(58) Field of Classification Search
CPC ......... H10L 23/60; H10B 53/30; H10B 61/00; H10B 63/80
See application file for complete search history.

(56) References Cited

U.S. PATENT DOCUMENTS

| | | | |
|---|---|---|---|
| 2015/0001592 A1* | 1/2015 | Lai | H01L 21/02266 257/288 |
| 2017/0092584 A1* | 3/2017 | Sheng | H01L 21/32136 |
| 2023/0069107 A1* | 3/2023 | Wei | H10D 89/921 |

* cited by examiner

*Primary Examiner* — Sardis F Azongha
(74) *Attorney, Agent, or Firm* — The Marbury Law Group, PLLC

(57) ABSTRACT

A semiconductor device and methods of fabrication thereof including a substrate, a doped well formed in the substrate, a transistor formed on the substrate, a dielectric material located over the doped well and the transistor and including interconnect structures extending through the dielectric material, the interconnect structures including a first set of interconnect structures electrically coupled to an active region of the transistor and a second set of interconnect structures electrically coupled to the doped well, an active memory cell electrically coupled to the active region of the transistor via the first set of interconnect structures; and a dummy memory cell electrically coupled to the doped well via the second set of conductive interconnect structures. The dummy memory cell and the second set of conductive interconnect structures may provide a low resistance pathway for plasma charge to flow to the doped well, thereby minimizing plasma induced damage to the transistor.

20 Claims, 32 Drawing Sheets

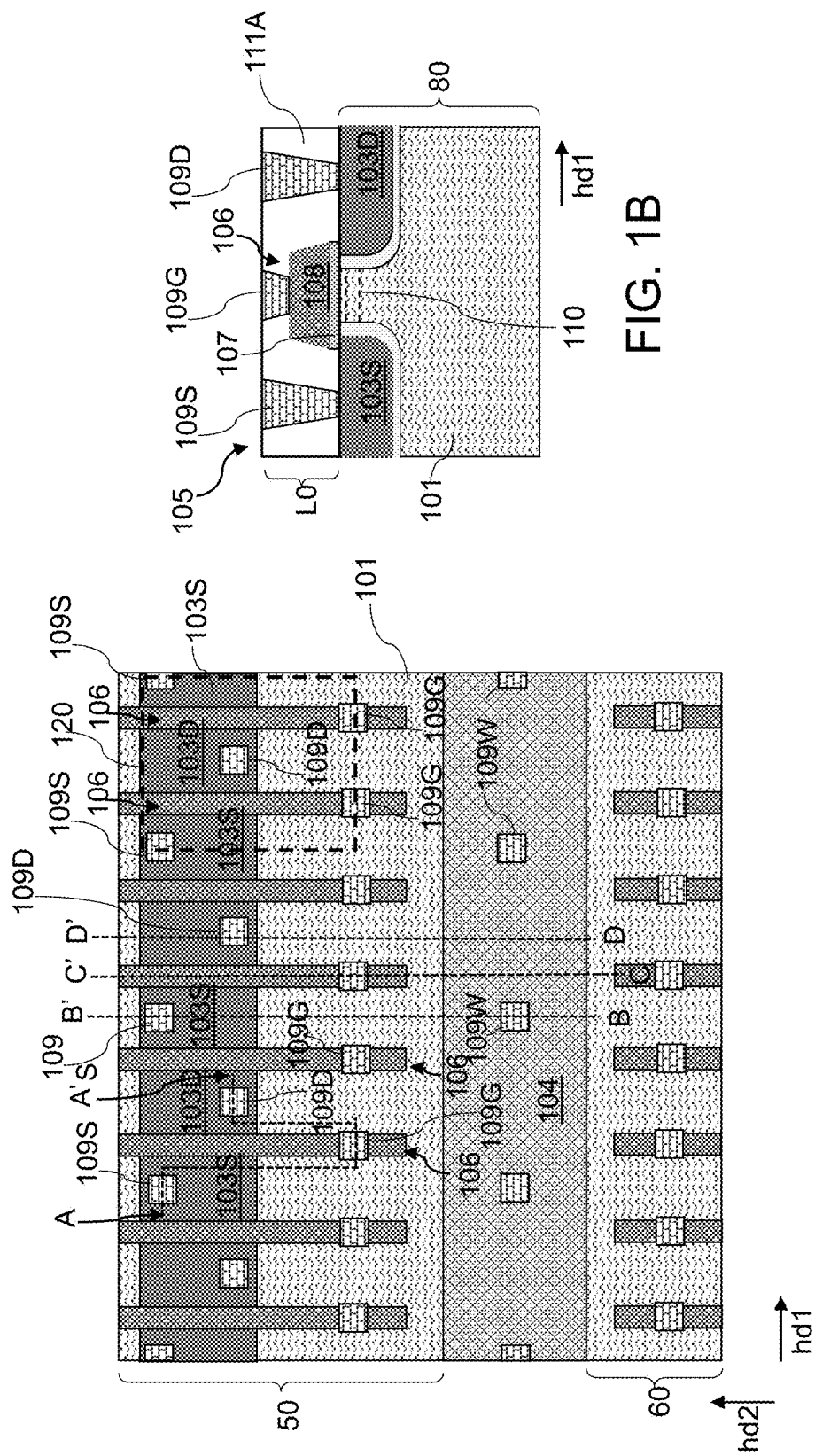

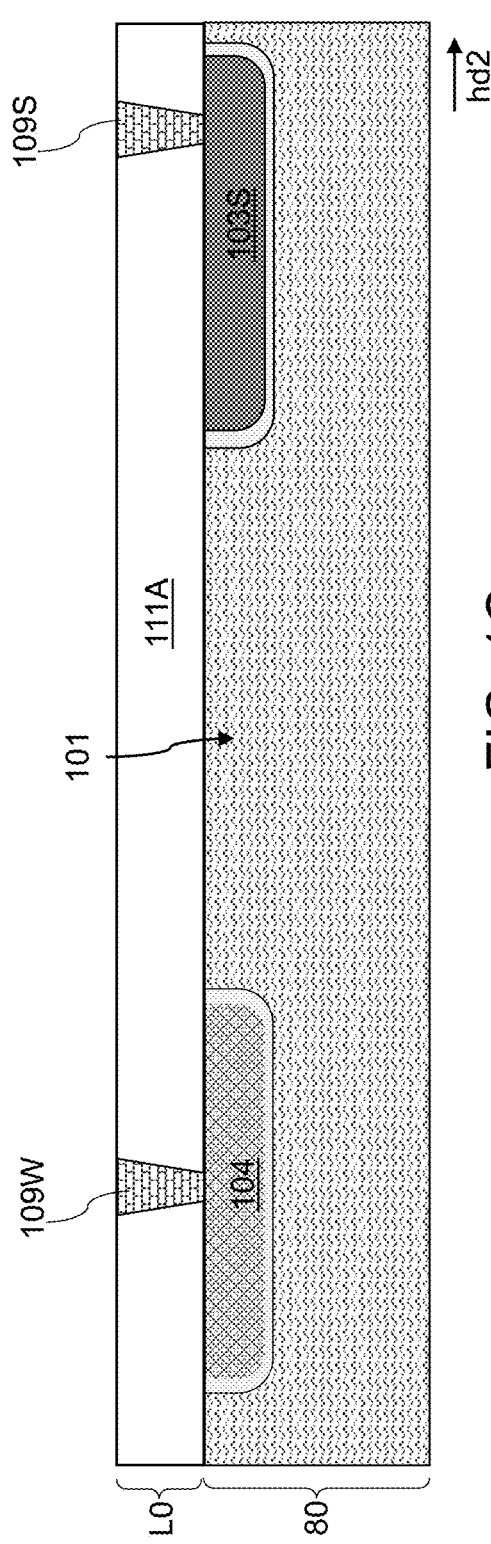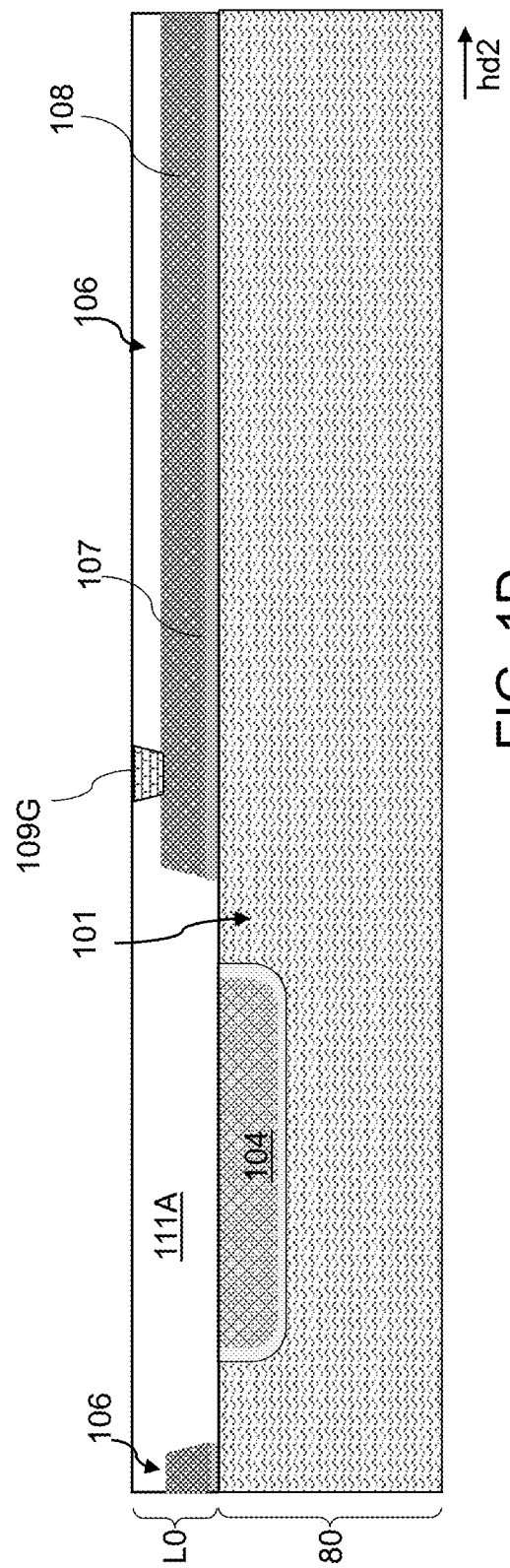

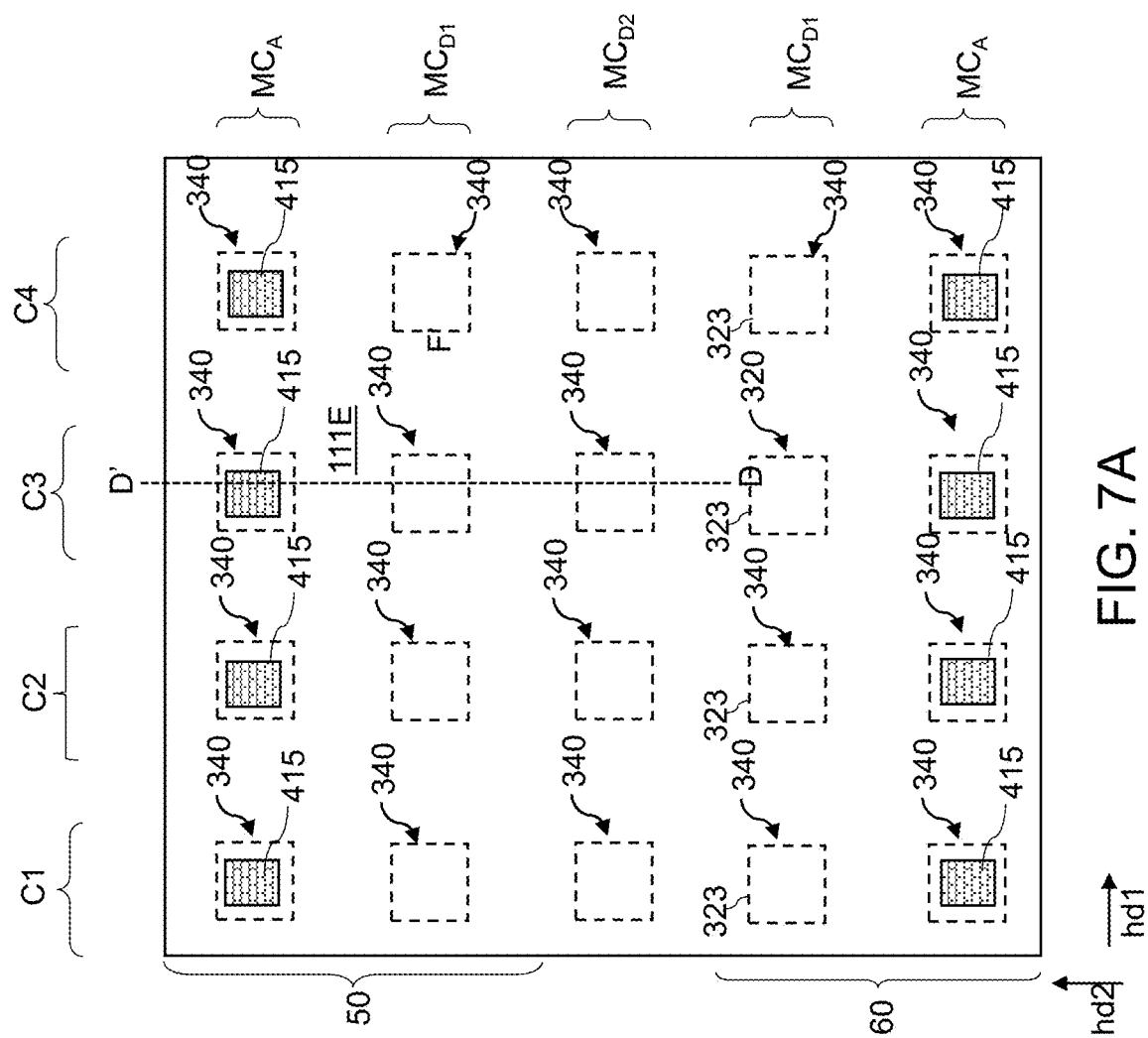

EMBEDDED MEMORY DEVICE WITH REDUCED PLASMA-INDUCED DAMAGE AND METHODS OF FORMING THE SAME

RELATED APPLICATIONS

This application claims priority from U.S. Provisional Application Ser. No. 63/411,714 entitled "Embedded Memory Device with Reduced Plasma-Induced Damage and Methods of Forming The Same," filed on Sep. 30, 2022, the entire contents of which are incorporated herein by reference for all purposes.

BACKGROUND

Emerging non-volatile memory device technologies, such as resistive random-access memory (RRAM or ReRAM), magnetoresistive random-access memory (MRAM), conductive-bridge random-access memory (CBRAM), and ferroelectric random-access memory (FeRAM), are often considered as potential replacements for flash memory. However, to date these technologies have not been widely adopted. There is a continuing need for improvements in emerging memory device technologies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a top view of an exemplary intermediate structure during a process of forming a semiconductor IC device including an array of embedded memory elements according to various embodiments of the present disclosure.

FIG. 1B is a vertical cross-section view of the exemplary intermediate structure viewed in offset cutting planes parallel to a first horizontal direction along line A-A' in FIG. 1A.

FIG. 1C is a vertical cross-section view of the exemplary intermediate structure along line B-B' in FIG. 1A.

FIG. 1D is a vertical cross-section view of the exemplary intermediate structure along line C-C' in FIG. 1A.

FIG. 7A is a top view of an exemplary intermediate structure during a process of forming a semiconductor IC device illustrating a fourth interconnect-level structure formed over the third interconnect-level structure according to various embodiments of the present disclosure.

DETAILED DESCRIPTION

Figure 1E:
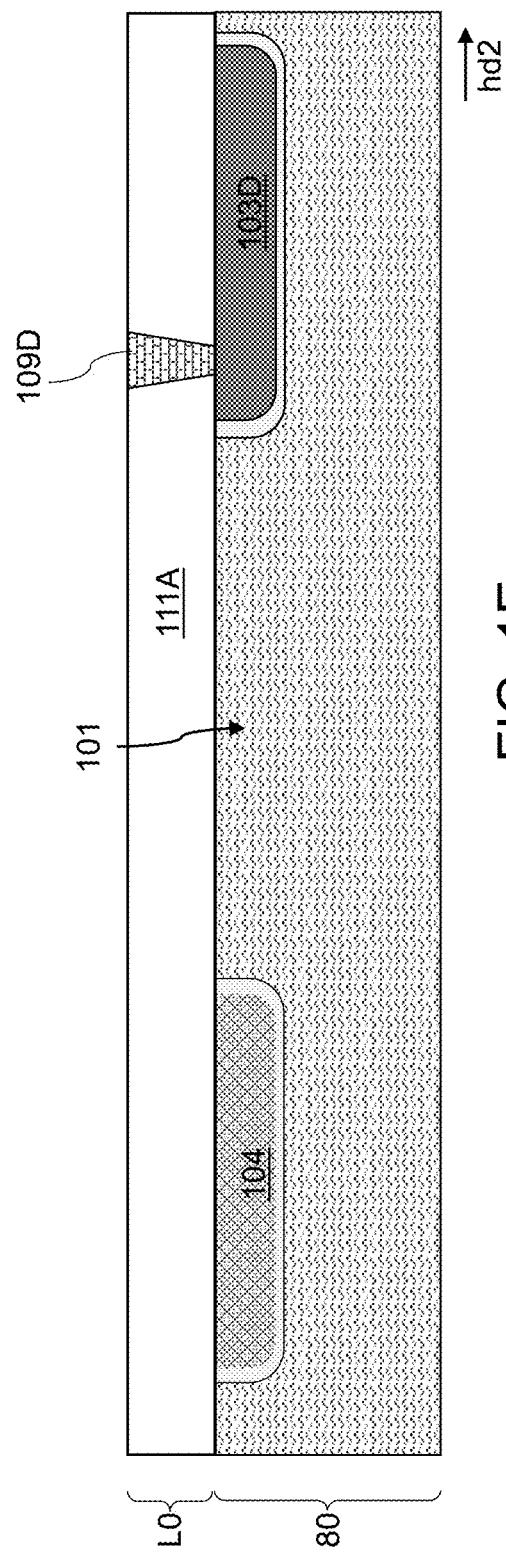
FIG. 1E is a vertical cross-section view of the exemplary intermediate structure along line D-D' in FIG. 1A.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, various embodiments disclosed herein may include semiconductor devices having embedded memory devices, such as non-volatile memory devices with reduced plasma induced damage (PID), and methods of forming semiconductor devices having the embodiment embedded memory devices.

The memory devices of the various embodiments may be formed as an array of individual memory elements (i.e., cells) over a common substrate (e.g., a semiconductor wafer) that may also contain semiconductor devices, such as field effect transistors (FETs). The semiconductor devices may be integrated with, and may also support the functionality of, the array of memory elements in the finished semiconductor integrated circuit (IC) device. Thus, the memory devices of the various embodiments may be referred to as "embedded memory devices." In various embodiments, semiconductor devices, such as FETs, may be formed on the substrate during front-end-of-line (FEOL) operations, and the embedded memory devices may be formed over the substrate (e.g., in one or more interconnect levels) during back-end-of-line (BEOL) operations.

A number of emerging non-volatile memory device technologies are attractive candidates for BEOL integration of embedded memory devices in semiconductor IC devices. Such memory technologies include, without limitation, resistive random-access memory (RRAM or ReRAM) devices, magnetoresistive random-access memory (MRAM) devices, conductive-bridge random-access memory (CBRAM) devices, and ferroelectric random-access memory (FeRAM) devices.

Ideally, the fabrication process for the embedded memory devices should not damage or otherwise interfere with the performance and operation of previously-fabricated devices on the substrate, such as transistors formed during FEOL operations.

The present applicants have discovered that processes used to fabricate embedded memory devices may have a deleterious effect on previously-fabricated devices on the common substrate, such as field effect transistors (FETs) formed during FEOL operations. In particular, some processes used during the fabrication of the array of memory elements, such as plasma-assisted material deposition processes and/or plasma-assisted etching processes, may produce an accumulation of charged particles (e.g., electrons) on the in-progress semiconductor IC device. These charged particles may travel through the conductive interconnect structures (e.g., metal lines and vias) of the interconnect levels where it can damage the underlying devices (e.g. FETs) that were previously-fabricated on the semiconductor substrate during FEOL operations. This effect may be referred to as "plasma induced damage" (PID). In the case of FETs, for example, the plasma charge may damage the gate oxide layers of the FETs. This may result in a higher failure rate and lower device yields.

In order to address the problem of plasma induced damage (PID) in semiconductor IC devices including embedded memory devices, various embodiments of the present disclosure include forming a doped well in the substrate of the semiconductor IC device, and providing a low resistance pathway for plasma charge to reach the doped well. In various embodiments, a set of conductive interconnect structures, including metal lines and vias, may be formed extending continuously between an interconnect-level structure in which the array of memory elements are formed and the doped well in the device substrate. In various embodiments, plasma charge generated during the fabrication of the memory elements may travel through the set of conductive interconnect structures to reach the doped well, where the charged particles may easily flow into the doped well. Thus, by providing a relatively lower resistance pathway to the doped well, a large portion of the plasma charge generated during the fabrication of the memory elements may flow to the doped well rather than to the semiconductor devices (e.g., FETs) formed on the substrate.

In various embodiments, an array of embedded memory cells may be formed including a set of active (i.e., functional) memory cells electrically coupled to an active region of an underlying transistor, and a set of dummy (i.e., non-functional) memory cells electrically coupled to the doped well by a low-resistance pathway. In some embodiments, sets of conductive interconnect structures that are electrically coupled to gate electrodes of transistors formed on the substrate may be electrically isolated from the array of embedded memory cells by a dielectric material. An additional set of dummy memory cells may be formed at least partially overlying the conductive interconnect structures that are electrically coupled to the gate electrodes, where the additional set of dummy memory cells may be electrically isolated from the substrate and the semiconductor devices (e.g., FETs) formed thereon. This may help to protect the transistors, including the gate dielectric layers of the transistors, from plasma induced damage. Accordingly, a lower failure rate and higher device yields for the semiconductor IC devices may be obtained.

FIG. 1A is a top view of an exemplary intermediate structure during a process of forming a semiconductor IC device including an array of embedded memory elements according to various embodiments of the present disclosure. For sake of illustration, dielectric layer 111A is not shown in FIG. 1A. FIG. 1B is a vertical cross-section view of the exemplary intermediate structure viewed in offset cutting planes parallel to a first horizontal direction hd1 along line A-A' in FIG. 1A. FIG. 1C is a vertical cross-section view of the exemplary intermediate structure along line B-B' in FIG.

1A. FIG. 1D is a vertical cross-section view of the exemplary intermediate structure along line C-C' in FIG. 1A. FIG. 1E is a vertical cross-section view of the exemplary intermediate structure along line D-D' in FIG. 1A.

Referring to FIGS. 1A-1E, the exemplary intermediate structure may include a substrate 80 that contains a semiconductor material layer 101. The substrate 80 may include a bulk semiconductor substrate such as a silicon substrate in which the semiconductor material layer 101 continuously extends from a top surface of the substrate 80 to a bottom surface of the substrate 80, or a semiconductor-on-insulator layer including the semiconductor material layer 101 as a top semiconductor layer overlying a buried insulator layer (such as a silicon oxide layer). The exemplary intermediate structure may include various device regions, including a first device region 50 and a second device region 60 as shown in FIG. 1A. The first device region 50 may be a memory array region in which a plurality of non-volatile memory cells may be subsequently formed. The second device region 60 may be an additional memory array region, a logic device region, a peripheral circuitry region, etc.

Referring to FIGS. 1A and 1B, semiconductor devices such as field effect transistors (FETs) may be formed on, and/or in, the semiconductor material layer 101 during a front-end-of-line (FEOL) operation. Various doped wells may be formed in various regions of the upper portion of the semiconductor material layer 101 by performing masked ion implantation processes. In some embodiments, a doped well 104 including dopants of a first conductivity type (e.g., p-type dopants or n-type dopants) may be formed in the upper portion of the semiconductor material layer 101 along a periphery of the first device region 50, such as between the first device region 50 and the second device region 60. The doped well 104 may extend along a first horizontal direction hd1 as shown in FIG. 1A. Isolation structures, such as shallow trench isolation structures (not shown in FIGS. 1A and 1B) may also be formed in the upper portion of the semiconductor material layer 101 by forming shallow trenches and subsequently filling the shallow trenches with a dielectric material such as silicon oxide. Other suitable dielectric materials are within the contemplated scope of disclosure.

Gate structures 106 may be formed over the top surface of the substrate 80 by depositing and patterning a gate dielectric layer 107 and a gate electrode layer 108 over the gate dielectric layer 107. In some embodiments, an optional a gate cap dielectric layer (not shown in FIGS. 1A and 1B) may be formed over the gate electrode layer 108. Each gate structure 106 may include a vertical stack of a gate dielectric 107, a gate electrode 108, and an optional gate cap dielectric layer, and may also be referred to as a gate stack 106. In various embodiments, the gate dielectric layer 107 may be formed, for example, by thermal oxidation of a surface portion of the semiconductor material layer 101. The gate electrode layer 108 (which may include polysilicon and/or at least one metallic material) may be deposited over the gate dielectric layer 107. In embodiments in which the gate electrode layer 108 includes a polysilicon, material regions of the polysilicon material to be used as gate electrodes can be suitably implanted with p-type dopants or n-type dopants. The gate electrode layer 108 and the gate dielectric layer 107 may be subsequently patterned, for example, by applying and patterning a photoresist layer over the gate electrode layer 108 into a pattern of gate electrodes, and by anisotropically etching unmasked portions of the gate electrode layer 108 and the gate dielectric layer 107 to form a plurality of gate structures 106. Optional dielectric spacers (not shown in FIGS. 1A and 1B) may be formed over the sidewalls of the gate structures 106. In the embodiment shown in FIGS. 1A and 1B, the gate structures 106 may be strip-shaped structures that extend along a second horizontal direction hd2 and are separated from one another along the first horizontal direction hd1.

Ion implantation processes may be performed to form active regions 103, which may be a source region or a drain region based on electrical biasing. The ion implantation processes may use the gate structures 106 as self-aligned implantation masks to form the active regions 103. In various embodiments, the active regions 103 may include dopants of a second conductivity type (e.g., n-type or p-type) that is opposite to the first conductivity type dopants of the doped well 104. For example, in embodiments in which the doped well 104 is a p-type well, the active regions 103 may be n-type active regions 103, and vice versa. A semiconductor channel 110 may be provided underneath each gate structure 106 between a neighboring pair of active regions 103 as illustrated in FIG. 1B.

Each combination of a gate structure 106, a semiconductor channel 110, and a pair of active regions 103 (one of which functions as a source region 103S and another of which functions as a drain region 103D) may form a transistor 105 (e.g., a field effect transistor (FET)). Source/drain region(s) may refer to a source or a drain, individually or collectively dependent upon the context. The transistors 105 formed on the semiconductor material layer 101 may function as access transistors for an array of embedded memory elements to be subsequently formed in the memory device region 50 of the exemplary intermediate structure. The access transistors may provide functions that are needed to operate the individual memory elements of the array. Specifically, the access transistors may be configured to control a programming operation, an erase operation, and a sensing (read) operation of the embedded memory elements. In some embodiments, each of the memory elements may be electrically coupled to a node (e.g., the drain region 103D) of an underlying access transistor via conductive interconnect structures (e.g., metal lines and vias). The other nodes of the access transistor may be coupled to signal lines. For example, the source region 103S of the access transistor may be electrically coupled to a source line, and the gate electrode 108 may be electrically coupled to a word line. This may enable each memory element of the array to be individually accessed in order to perform a programming operation, an erase operation, and/or a sensing (read) operation on the memory element (i.e., memory cell).

In various embodiments described in further detail below, the access transistors for each memory element of the array may include a double-gate configuration in which a voltage may be simultaneously applied to two adjacent gate electrodes 108 on either side of a common active region 103. In particular, in embodiments in which the memory elements are electrically coupled to the drain regions 103D of the access transistors, the access transistor for each memory element may effectively include a pair of adjacent transistors 105 which share a common drain region 103D. An exemplary embodiment of an access transistor for a memory element having a double-gate configuration is shown in region 120 of FIG. 1A, which includes a common drain region 103D surrounded by a gate structure 106 and a source region 103S on two opposite sides of the common drain region 103D. A double-gate configuration for the access transistor as shown in FIG. 1A may enable a higher driving current to be applied to the memory element that is electrically coupled to the access transistor.

Referring again to FIGS. 1A-1E, contact-level interconnect structures may be formed over the semiconductor material layer 101 and over the plurality of semiconductor devices (e.g., transistors 105) formed on and/or in the semiconductor material layer 101. The contact-level interconnect structures may include a first dielectric material layer 111A and a plurality of contact via structures 109 (109D, 109G, 109S) formed within the first dielectric material layer 111A. For clarity of illustration, the first dielectric material layer 111A is not shown in the top view of FIG. 1A. The first dielectric material layer 111A may include a suitable dielectric material, such as silicon oxide, silicon nitride, silicon oxynitride, and the like. Other suitable dielectric materials are within the contemplated scope of disclosure. The first dielectric material layer 111A may be deposited using a suitable deposition process, such as chemical vapor deposition (CVD), physical vapor deposition (PVD), atomic layer deposition (ALD), high density plasma CVD (HDPCVD), metalorganic CVD (MOCVD), plasma enhanced CVD (PECVD), sputtering, laser ablation, or the like. A planarization process, such as a chemical and mechanical planarization (CMP) process, may be used to provide a planar upper surface of the first dielectric material layer 111A.

The plurality of contact via structures 109 may be formed by patterning the first dielectric material layer 111A to form openings through the first dielectric material layer 111A, and depositing an electrically conductive material within the openings to form the plurality of contact via structures 109. The first dielectric material layer 111A may be patterned, for example, by applying and lithographically patterning a photoresist layer over the first dielectric material layer 111A to form a mask having a desired pattern of openings, and by anisotropically etching unmasked portions of the first dielectric material layer 111A through the mask to transfer the pattern of openings to the first dielectric material layer 111A. Electrically conductive material may then be deposited in the openings in the first dielectric material layer 111A using a suitable deposition process, such as physical vapor deposition (PVD), sputtering, chemical vapor deposition (CVD), atomic layer deposition (ALD), plasma-enhanced chemical vapor deposition (PECVD), electrochemical deposition (e.g., electroplating), or combinations thereof. Each of contact via structures 109 may include a respective metallic liner (such as a layer of TiN, TaN, or WN having a thickness in a range from 2 nanometers (nm) to 20 nm) and a respective metallic fill material (such as W, Cu, Co, Mo, Ru, other elemental metals, or an alloy or a combination thereof). Other suitable materials for use as a metallic liner and metallic fill material are within the contemplated scope of disclosure. A planarization process, such as a CMP process, may be utilized to remove portions of the metallic liner material and/or the metallic fill material from over the upper surface of the first dielectric material layer 111A to provide a plurality of discrete contact via structures 109 embedded in the first dielectric material layer 111A. The combination of the first dielectric material layer 111A and the plurality of contact via structures 109 extending through the first dielectric material layer 111A may be referred to as a contact-level structure L0.

Referring again to FIGS. 1A-1E, a plurality of first contact via structures 109S may electrically contact a respective source region 103S of the plurality of transistors 105, a plurality of second contact via structures 109D may electrically contact a respective drain region 103D of the plurality of transistors 105, and a plurality of third contact via structures 109G may electrically contact a respective gate electrode 108 of the plurality of transistors 105. A plurality of fourth contact via structures 109W may contact the doped well region 104. The plurality of first contact via structures 109S may be offset from the plurality of second contact via structures 109D along the second horizontal direction hd2. The plurality of third contact via structures 109G may be offset from the plurality of first contact structures 109S and the plurality of second contact via structures 109D along the second horizontal direction hd2. The plurality of fourth contact via structures 109W may be offset from the plurality of third contact via structures 109G along the second horizontal direction hd2. The plurality of third contact via structures 109G may be located between the fourth contact via structures 109W and the first and second contact via structures 109S, 109D along the second horizontal direction hd2. As shown in FIGS. 1A and 1C, in some embodiments, each of the first contact via structures 109S may be aligned with a corresponding fourth contact via structure 109W along the first horizontal direction hd1.

Figure 2A:
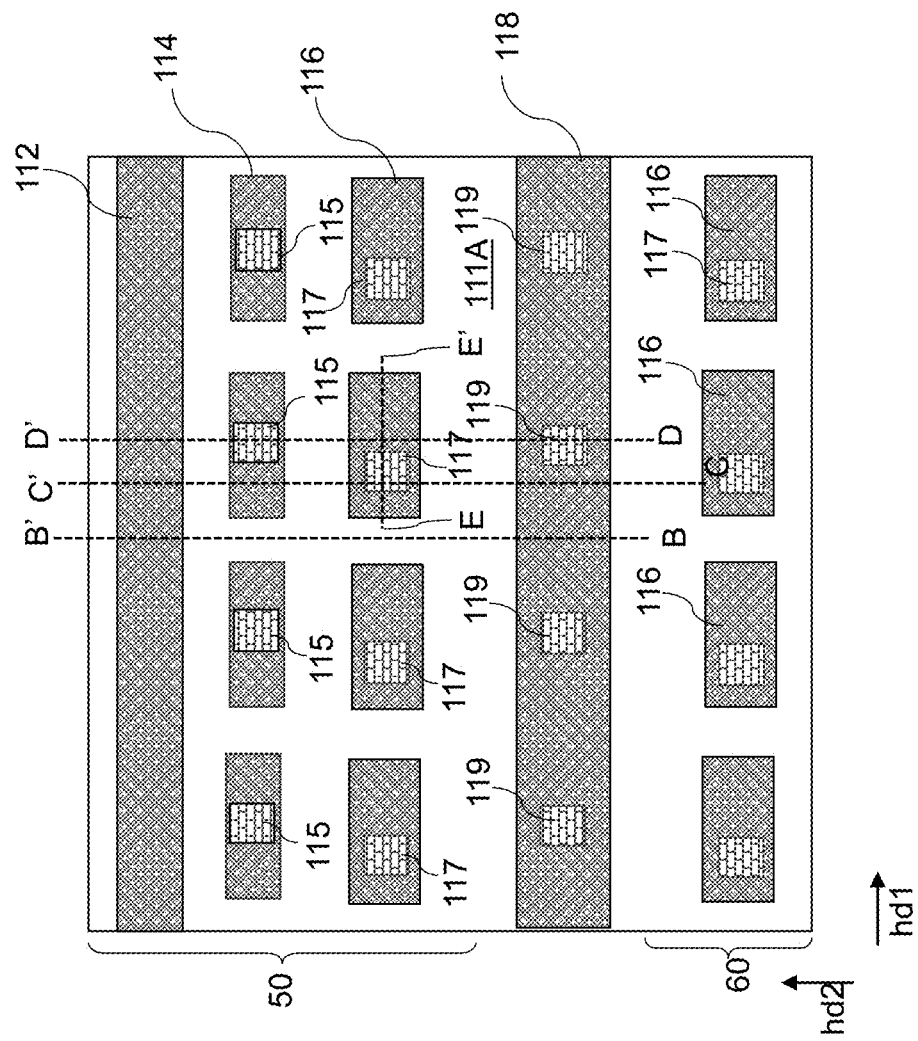
FIG. 2A is a top view of an exemplary intermediate structure during a process of forming a semiconductor IC device including an array of embedded memory elements following the formation of a first interconnect-level structure according to various embodiments of the present disclosure.
Figure 2B:
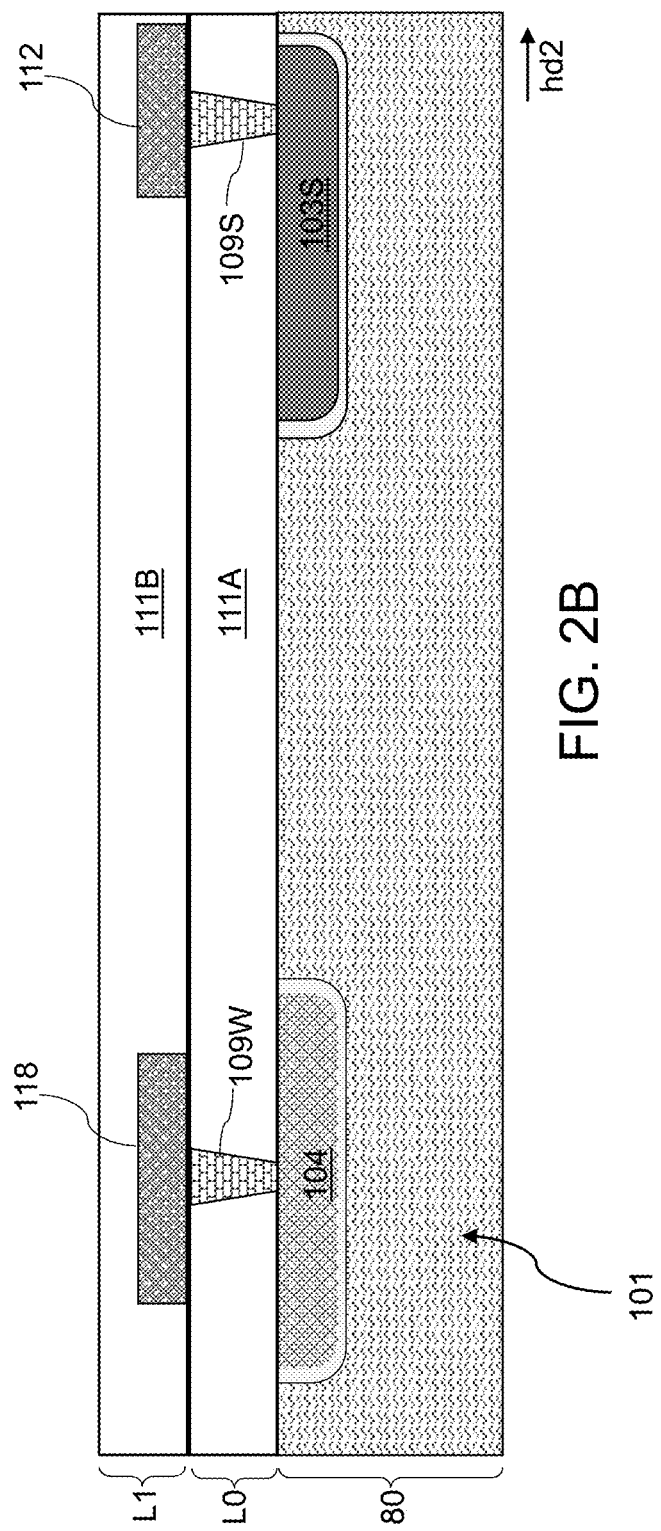
FIG. 2B is a vertical cross-section view of the exemplary intermediate structure along line B-B' in FIG. 2A.
Figure 2C:
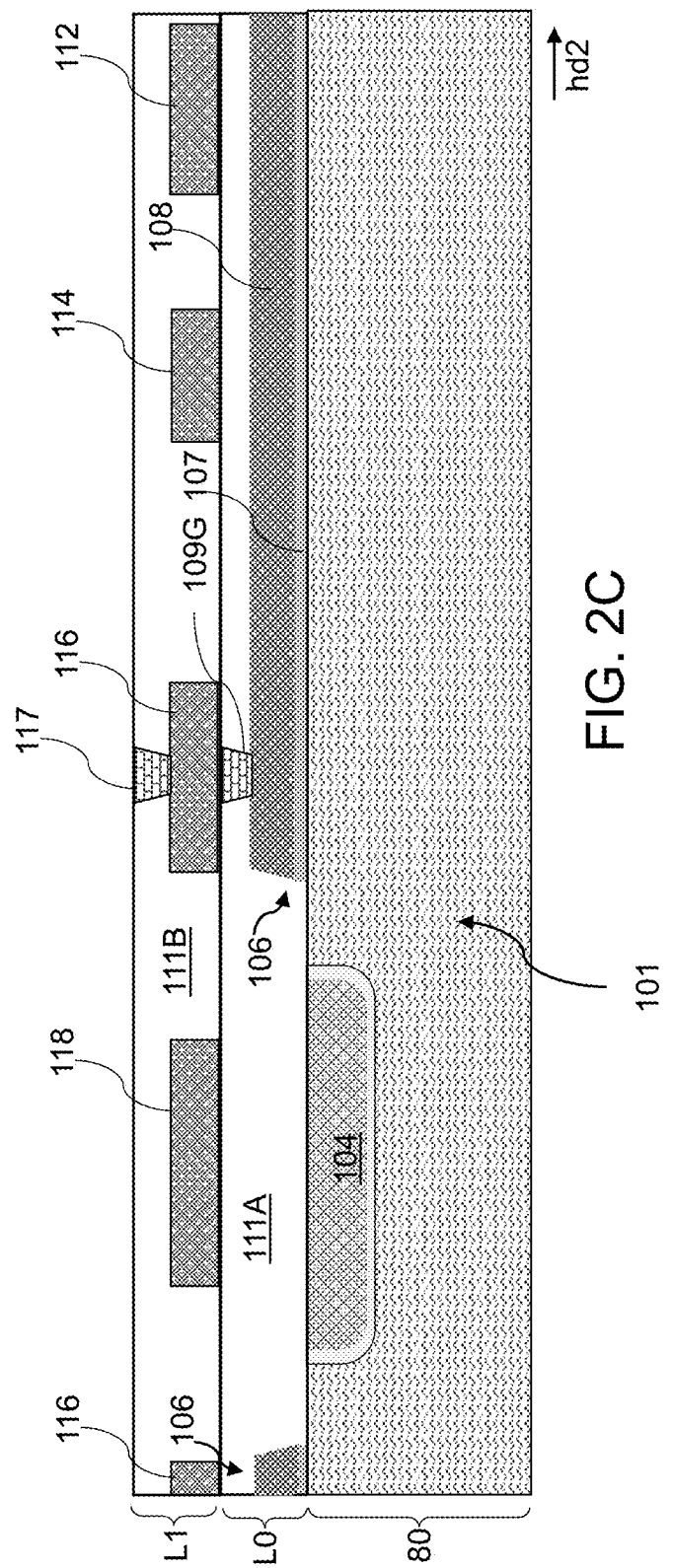
FIG. 2C is a vertical cross-section view of the exemplary intermediate structure along line C-C' in FIG. 2A.
Figure 2D:
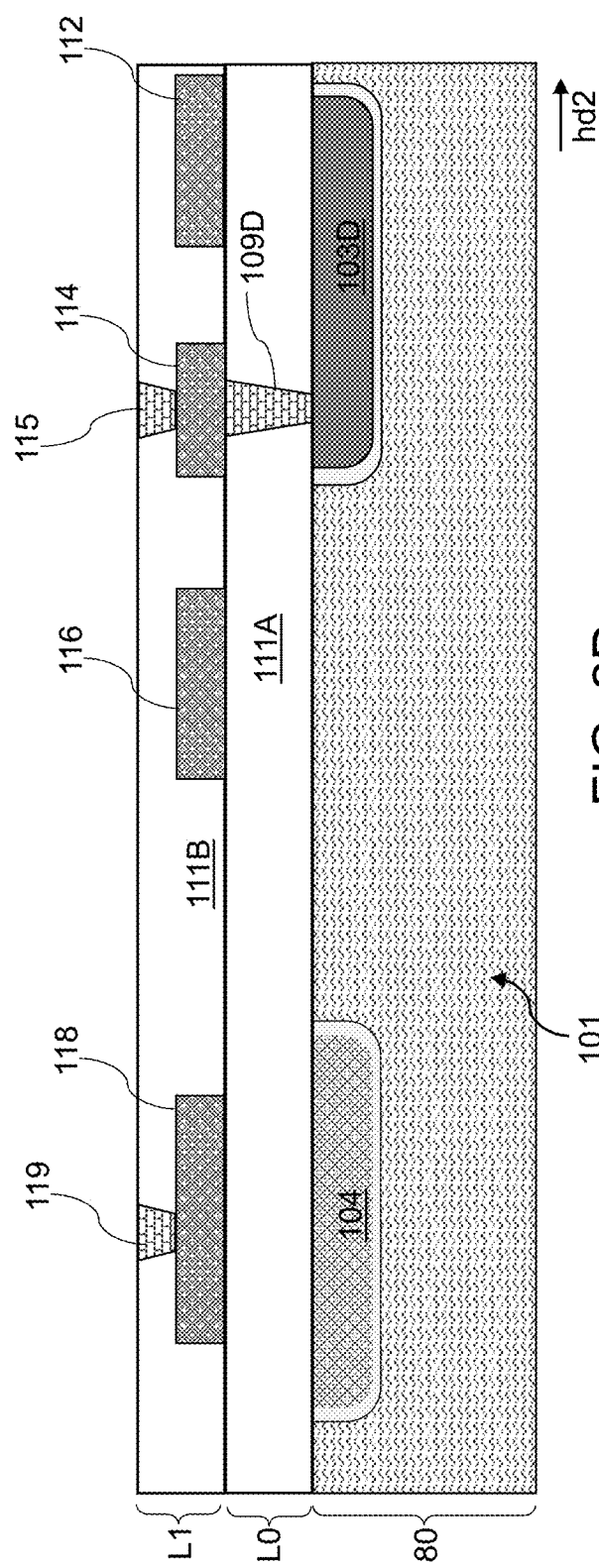
FIG. 2D is a vertical cross-section view of the exemplary intermediate structure along line D-D' in FIG. 2A.
Figure 2E:
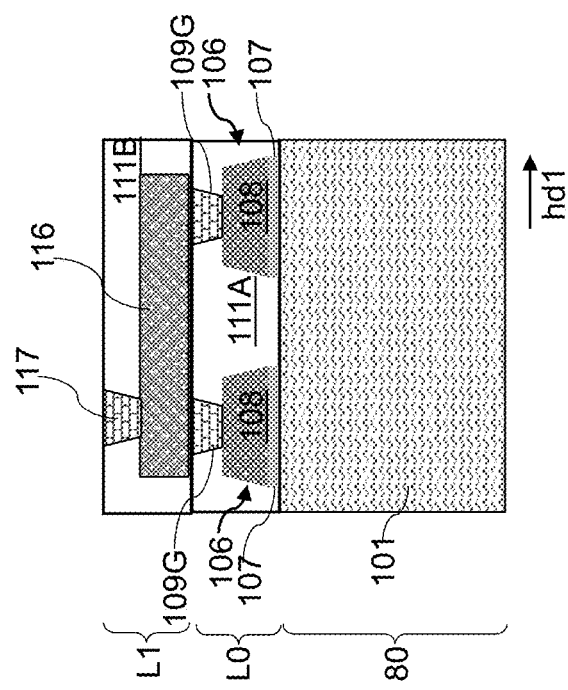
FIG. 2E is a vertical cross-section view of the exemplary intermediate structure along line E-E' in FIG. 2A.

FIG. 2A is a top view of an exemplary intermediate structure during a process of forming a semiconductor IC device including an array of embedded memory elements following the formation of a first interconnect-level structure L1 according to various embodiments of the present disclosure. For sake of illustration, dielectric layer 111B is not shown in FIG. 2A. FIG. 2B is a vertical cross-section view of the exemplary intermediate structure along line B-B' in FIG. 2A. FIG. 2C is a vertical cross-section view of the exemplary intermediate structure along line C-C' in FIG. 2A. FIG. 2D is a vertical cross-section view of the exemplary intermediate structure along line D-D' in FIG. 2A. FIG. 2E is a vertical cross-section view of the exemplary intermediate structure along line E-E' in FIG. 2A.

Referring to FIGS. 2A-2E, a second dielectric material layer 111B, first interconnect-level metal lines 112, 114, 116 and 118 and first interconnect-level metal vias 115, 117 and 119 may be formed over the upper surface contact-level structure L0. For clarity of illustration, the second dielectric material layer 111B is not shown in the top view of FIG. 2A. Collectively, the second dielectric material layer 111B, the first interconnect-level metal lines 112, 114, 116 and 118 and the first interconnect-level metal vias 115, 117 and 119 may be referred to as a first interconnect-level structure L1.

The second dielectric material layer 111B may be formed by depositing a dielectric material, as silicon oxide, silicon nitride, silicon oxynitride, and the like, over the upper surface of the first interconnect-level structure L1. The dielectric material may be deposited using a suitable deposition process as described above. The second dielectric material layer 111B may be patterned as described above to form openings through the second dielectric material layer 111B, and electrically conductive material may be deposited within the openings via a suitable deposition process as described above to form the first interconnect-level metal lines 112, 114, 116 and 118 and the first interconnect-level metal vias 115, 117 and 119 within the second dielectric material layer 111B. For example, a lower portion of the second dielectric material may be deposited over the contact-level structure L0 and may be patterned to form openings for the first interconnect-level metal lines 112, 114, 116 and 118. Following deposition of electrically conductive material within the openings and an optional planarization process to form the first interconnect-level metal lines 112, 114, 116 and 118, an upper portion of the second dielectric material layer 111B may be deposited over the lower portion of the second dielectric material layer 111B and the first interconnect-level metal lines 112, 114, 116 and 118. The upper portion of the second dielectric material layer 111B may then be patterned to form openings for the first interconnect-level metal vias 115, 117 and 119, and an electrically conductive material may be deposited within the openings to form the first interconnect-level metal vias 115, 117 and 119. Each of the first interconnect-level metal vias 115, 117 and 119 may electrically contact an underlying first interconnect-level metal line 114, 116 or 118. In various embodiments, the first interconnect-level metal lines 112, 114, 116 and 118 and the first interconnect-level metal vias 115, 117 and 119 may each include a metallic liner and a metallic fill material as described above.

Referring to FIGS. 2A-2D, a first metal line 112 of the first interconnect-level structure L1 may extend continuously along the first horizontal direction hd1 within the memory device region 50. The first metal line 112 may overlie and electrically contact a plurality of first contact via structures 109S of the underlying contact-level structure L0. Thus, the first metal line 112 may be electrically coupled via the first contact via structures 109S to a plurality of source regions 103S of the underlying transistors 105 extending in a row along the first horizontal direction hd1. FIG. 2B illustrates a first contact via structure 109S extending between the lower surface of the first metal line 112 and a source region 103S of a transistor 105. In some embodiments, the first metal line 112 may be electrically coupled to the source regions 103S of all of the transistors 105 within a given row of the memory device region 50. The first metal line 112 may thus be referred to as a "source line 112" of the memory array to be subsequently formed within the memory device region 50. Although a single source line 112 is shown in FIGS. 2A-2D, it will be understood that a memory device region 50 may include more than one source line 112, where each source line 112 may be coupled to the source regions 103S of transistors 105 located in different rows of the memory device region 50.

Referring to FIGS. 2A, 2C and 2D, a plurality of second metal lines 114 of the first interconnect-level structure L1 may extend in a row along the first horizontal direction hd1. The plurality of second metal lines 114 may be spaced from the first metal line 112 along the second horizontal direction hd2. The plurality of second metal lines 114 may be discontinuous with one another, meaning that each of the second metal lines 114 may be laterally surrounded on all sides by the second dielectric material layer 111B. Each of the second metal lines 114 may overlie and electrically contact a second contact via structure 109D of the underlying contact-level structure L0. Thus, each of the second metal lines 114 in a given row may be electrically coupled via a second contact via structure 109D to a drain region 103D of an underlying transistor 105 extending in a row along the first horizontal direction hd1. Metal vias 115 may contact the upper surfaces of each of the second metal lines 114. In some embodiments, each of the metal vias 115 contacting an upper surface of a second metal line 114 may be vertically aligned with a second contact via structure 109D contacting the lower surface of the second metal line 114, as shown in FIG. 2D. Although a single row of second metal lines 114 is shown in FIGS. 2A, 2D and 2D, it will be understood that a memory device region 50 may include more than row of second metal lines 114, where each row of second metal lines 114 may be coupled to the drain regions 109D of transistors 105 located in different rows of the memory device region 50.

Referring to FIGS. 2A, 2C, 2D and 2E, a plurality of third metal lines 116 of the first interconnect-level structure L1 may extend in a row along the first horizontal direction hd1. The plurality of third metal lines 116 may be spaced from the plurality of second metal lines 114 along the second horizontal direction hd2. The plurality of third metal lines 116 may be discontinuous with one another, meaning that each of the third metal lines 116 may be laterally surrounded on all sides by the second dielectric material layer 111B. Each of the third metal lines 116 may overlie and electrically contact a pair of third contact via structures 109G of the underlying contact-level structure L0. Thus, each of the third metal lines 116 in a given row may be electrically coupled via a pair of third contact via structures 109G to two adjacent gate electrodes 108 of the underlying transistors 105. FIG. 2E illustrates a third metal line 116 electrically coupled to adjacent gate electrodes 108 via a pair of third contact via structures 109G. As discussed above, in some embodiments the access transistors for the subsequently-formed memory elements may include a double-gate configuration. In particular, each of the access transistors may effectively include a pair of adjacent transistors 105 sharing a common drain region 103D. The configuration of the third metal lines 116 and the third contact via structures 109G may enable a common voltage signal to be simultaneously applied to the adjacent gate electrodes 108 of each access transistor. The drain regions 103D and second contact via structures 109D may be located between the pair of gate electrodes 108 and the corresponding third contact via structures 109G along the first horizontal direction hd1 in each of the access transistors. The exemplary intermediate structure may include multiple rows of third metal lines 116, where each of the third metal lines 116 may be electrically coupled to an underlying pair of gate electrodes 108. For example, FIG. 1A illustrates a row of third metal lines 116 located in the second device region 60. In some embodiments, one or more additional rows of metal lines 116 may be located in the memory device region 50.

The second metal lines 114 and the third metal lines 116 of the first interconnect-level structure L1 may both be generally rectangularly-shaped with a first dimension along the first horizontal direction hd1 greater than a second dimension along the second horizontal direction hd2. In some embodiments, the third metal lines 116 may have a greater area than the second metal lines 114. In some embodiments, each of the second metal lines 114 may be aligned with a corresponding third metal line 116 such that the second metal lines 114 do not extend beyond the peripheral edges of the corresponding third metal lines 116 along the first horizontal direction hd1, as shown in FIG. 2A. A metal via 117 may contact the upper surface of each of the third metal lines 116. The metal vias 117 contacting the upper surfaces of the third metal lines 116 may be laterally offset from the metal vias 115 contacting the upper surfaces of the second metal lines 114 along the first horizontal direction hd1. For example, as shown in FIG. 2A, the metal vias 117 contacting the third metal lines 116 are offset to the left with respect to the metal vias 115 contacting the corresponding second metal lines 114.

Referring to FIGS. 2A-2D, a fourth metal line 118 of the first interconnect-level structure L1 may extend continuously along the first horizontal direction hd1. The fourth metal line 118 may be spaced from the plurality of third metal lines 116 along the second horizontal direction hd2. In some embodiments, the fourth metal line 118 may extend along a periphery of the memory device region 50 and may overlie the doped well 104. The fourth metal line 118 may overlie and electrically contact a plurality of fourth contact via structures 109W of the underlying contact-level structure L0. Thus, the fourth metal line 118 may be electrically coupled via the fourth contact via structures 109W to the doped well 104. Although the embodiment of FIGS. 2A-2D illustrates a continuous fourth metal line 118, in other embodiments, a plurality of discontinuous fourth metal lines 118 may extend in a row along the first horizontal direction hd1. Each of the discontinuous fourth metal lines 118 may electrically contact at least one fourth contact via structure 109W and thus may be electrically coupled to the doped well 104. Further, although a single fourth metal line 118 extending over the doped well 104 is shown in FIGS. 2A-2D, it will be understood that the exemplary intermediate structure may include a plurality of fourth metal lines 118 each extending over and electrically coupled to a doped well 104.

Referring to FIGS. 2A and 2D, a plurality of metal vias 119 may contact the upper surface of the fourth metal line 118. Each of the metal vias 119 may be laterally offset from a corresponding fourth contact via structure 109W contacting the lower surface of the fourth metal line 118. In some embodiments, each of the metal vias 119 contacting an upper surface of the fourth metal line 118 may be located in a plane parallel to the second horizontal direction hd2 that also includes a metal via 115 contacting the upper surface of a second metal line 114, as is shown in FIG. 2D.

Figure 3A:
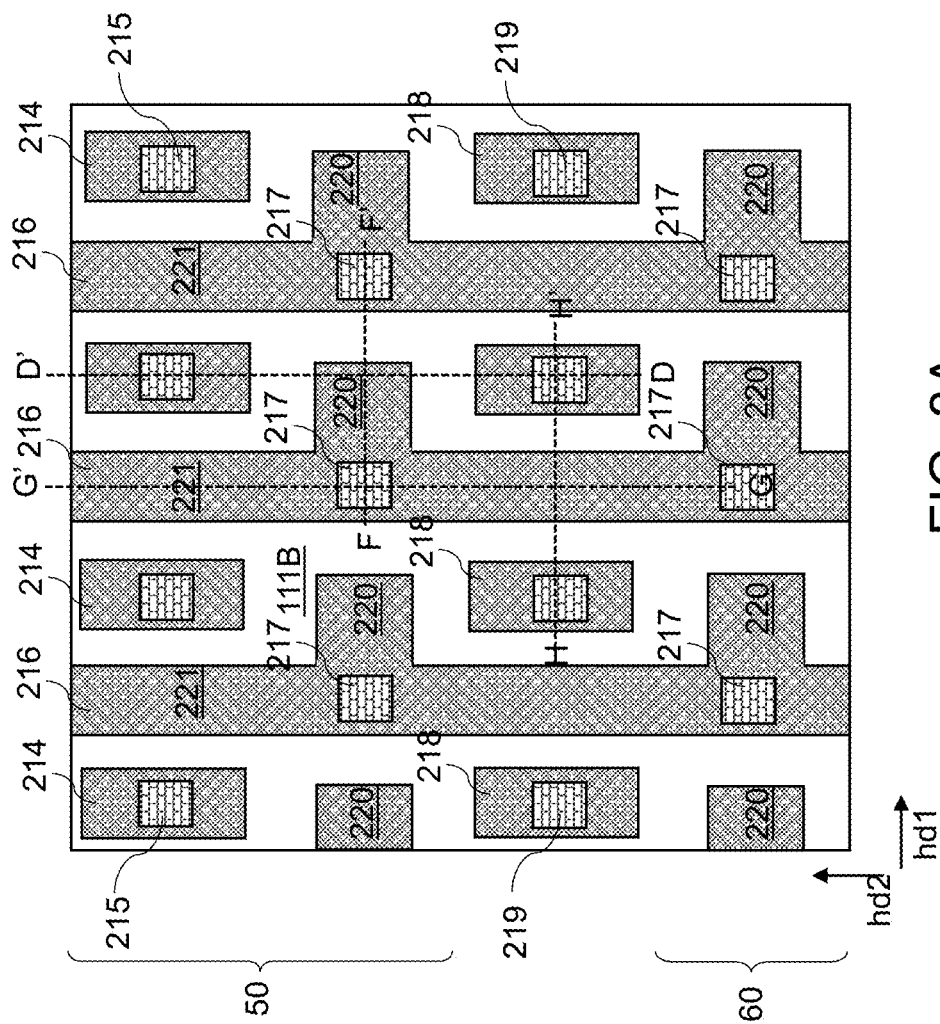
FIG. 3A is a top view of an exemplary intermediate structure during a process of forming a semiconductor IC device including an array of embedded memory elements following the formation of a second interconnect-level structure according to various embodiments of the present disclosure.
Figure 3B:
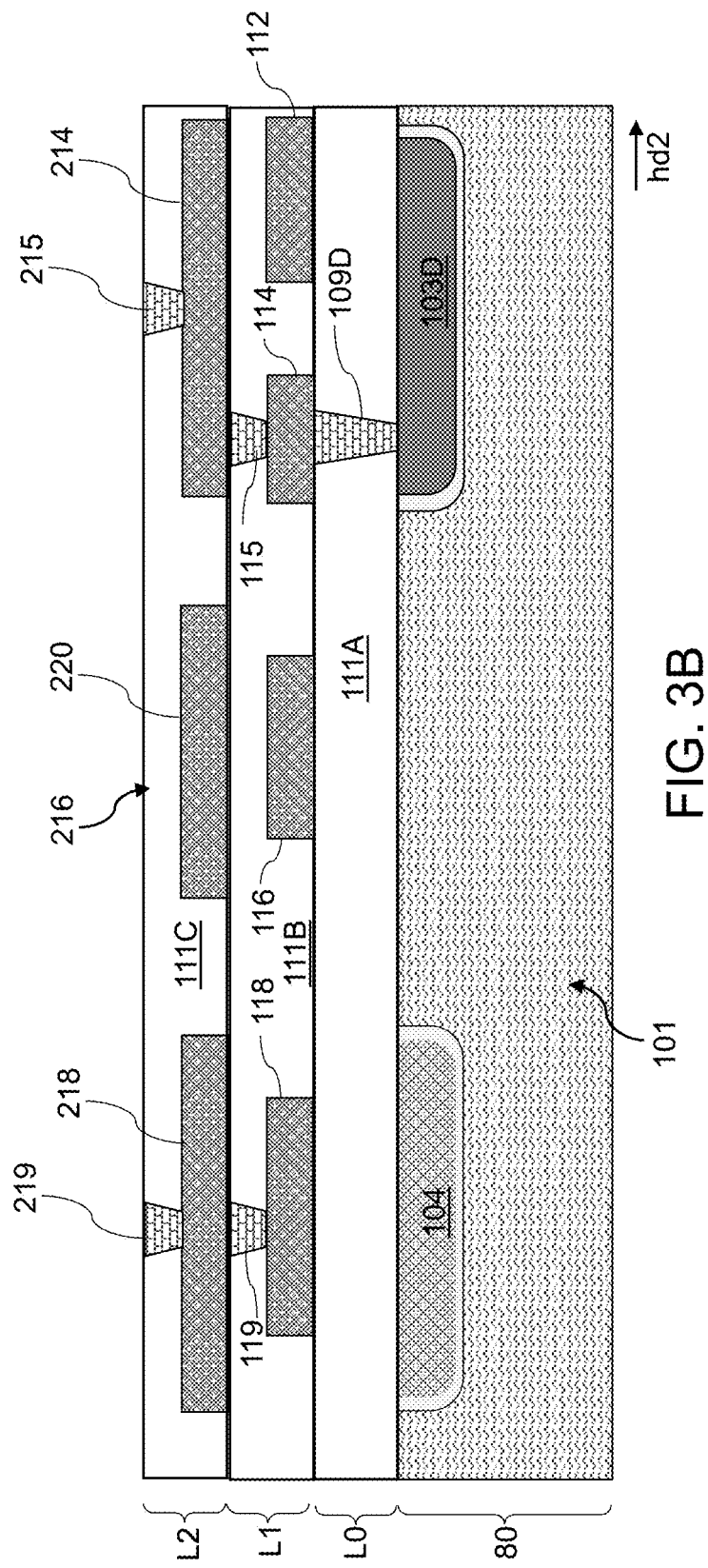
FIG. 3B is a vertical cross-section view of the exemplary intermediate structure along line D-D' in FIG. 3A.
Figure 3C:
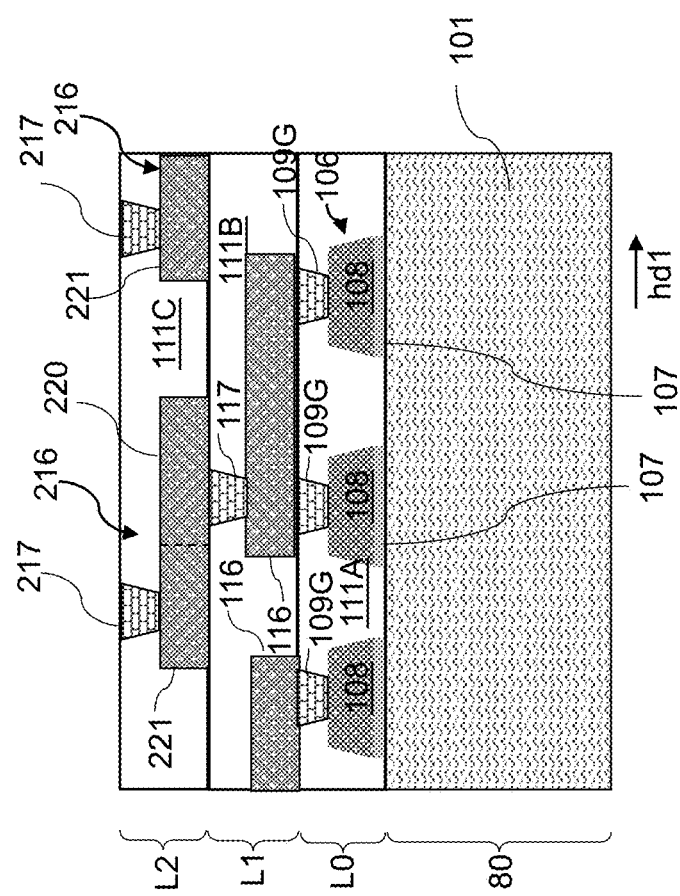
FIG. 3C is a vertical cross-section view of the exemplary intermediate structure along line F-F' in FIG. 3A.
Figure 3D:
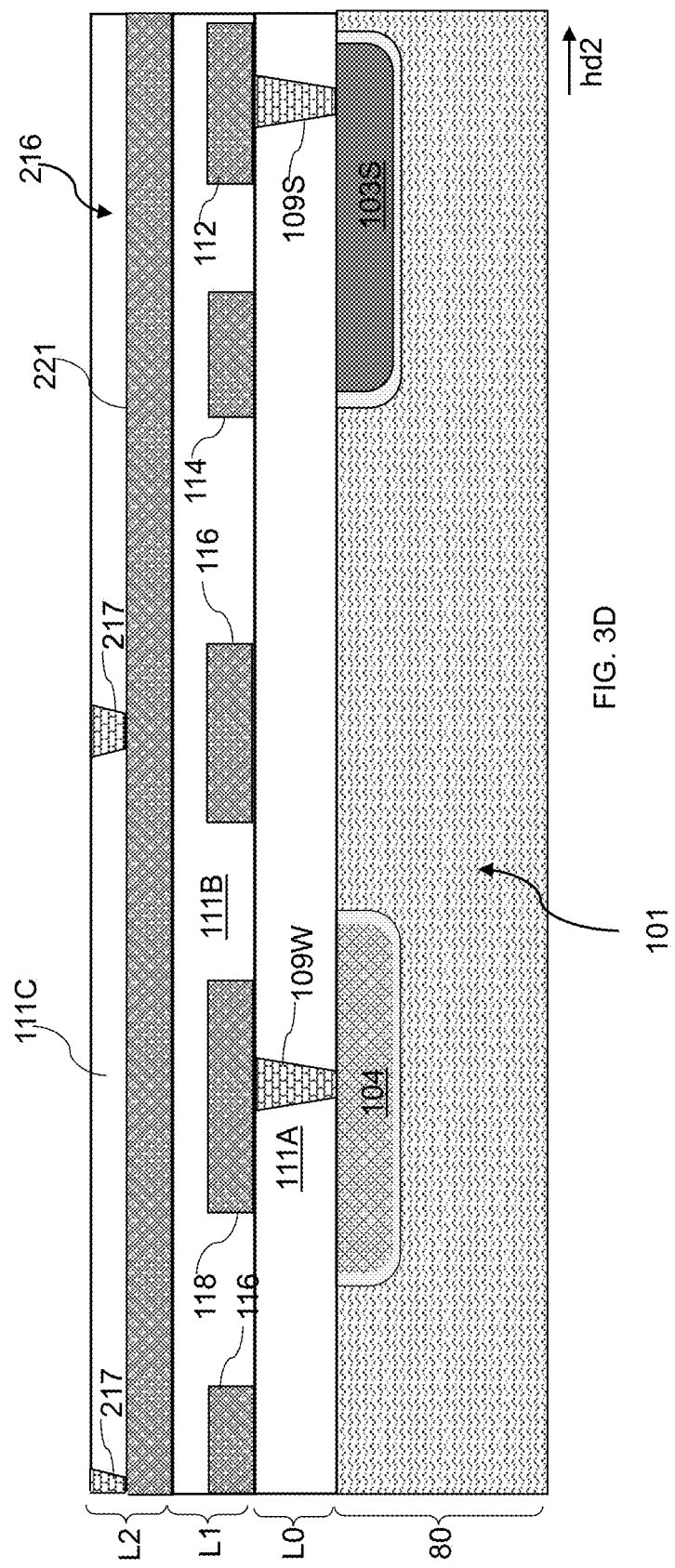
FIG. 3D is a vertical cross-section view of the exemplary intermediate structure along line G-G' in FIG. 3A.
Figure 3E:
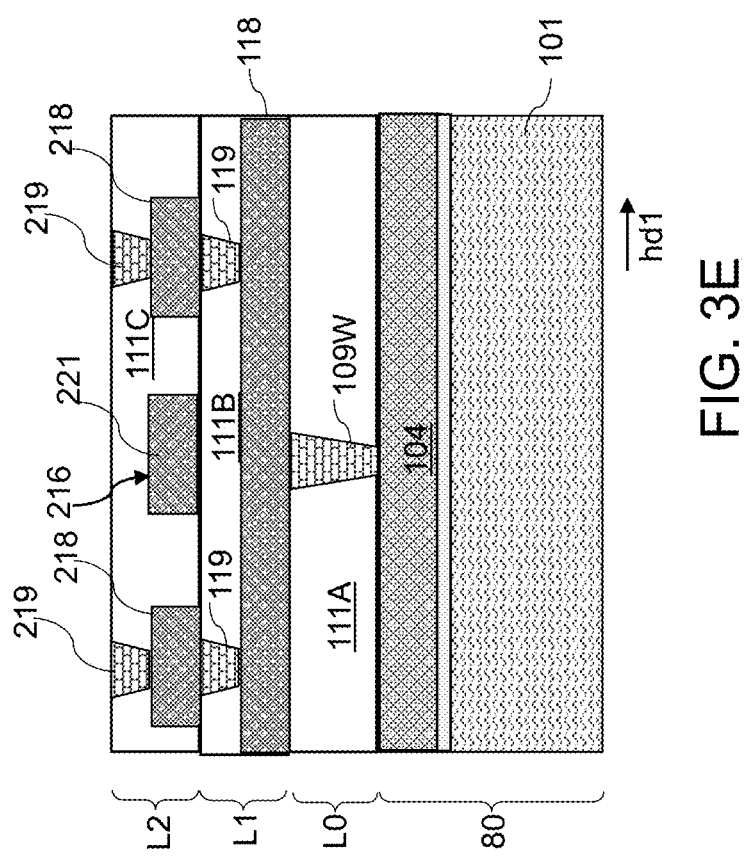
FIG. 3E is a vertical cross-section view of the exemplary intermediate structure along line H-H' in FIG. 3A.

FIG. 3A is a top view of an exemplary intermediate structure during a process of forming a semiconductor IC device including an array of embedded memory elements following the formation of a second interconnect-level structure L2 according to various embodiments of the present disclosure. For sake of illustration, dielectric layer 111C is not shown in FIG. 3A. FIG. 3B is a vertical cross-section view of the exemplary intermediate structure along line D-D' in FIG. 3A. FIG. 3C is a vertical cross-section view of the exemplary intermediate structure along line F-F' in FIG. 3A. FIG. 3D is a vertical cross-section view of the exemplary intermediate structure along line G-G' in FIG. 3A. FIG. 3E is a vertical cross-section view of the exemplary intermediate structure along line H-H' in FIG. 3A.

Referring to FIGS. 3A-3E, a third dielectric material layer 111C, second interconnect-level metal lines 214, 216 and 218 and second interconnect-level metal vias 215, 217 and 219 may be formed over the upper surface of the first interconnect-level structure L1. For clarity of illustration, the third dielectric material layer 111C is not shown in the top view of FIG. 3A. Collectively, the third dielectric material layer 111C, the second interconnect-level metal lines 214, 216 and 218 and the second interconnect-level metal vias 215, 217 and 219 may be referred to as a second interconnect-level structure L2.

The third dielectric material layer 111C, the second interconnect-level metal lines 214, 216 and 218 and the second interconnect-level metal vias 215, 217 and 219 of the second interconnect-level structure L2 may be formed using the same or equivalent processes and materials as described above for forming the second dielectric layer 111B, the first interconnect-level metal lines 112, 114, 116 and 118 and the first interconnect-level metal vias 115, 117 and 119 of the first interconnect-level structure L1. Thus, repeated discussion of like processes and materials is omitted for brevity.

Referring to FIGS. 3A and 3B, a plurality of first metal lines 214 of the second interconnect-level structure L2 may extend in a row along the first horizontal direction hd1 in the memory device region 50. Each of the first metal lines 214 may be laterally surrounded on all sides by the third dielectric material layer 111C. The first metal lines 214 may each have a generally rectangular shape with a dimension along the second horizontal direction hd2 that is greater than a dimension along the first horizontal direction hd1. Each of the first metal lines 214 of the second interconnect-level structure L2 may partially overlie a corresponding second metal line 114 of the first interconnect-level structure L1 and may also partially overlie the first metal line 112 (i.e., the source line) of the first interconnect level structure L1. Each of the metal vias 115 of the first interconnect-level structure L1 may extend between the upper surface of a second metal line 114 of the first interconnect-level structure L1 and a lower surface of a first metal line 214 of the second interconnect-level structure L2. Thus, each of the first metal lines 214 of the second interconnect-level structure L2 may be electrically coupled to a drain region 103D of an underlying transistor 105 via a metal via 115, a second metal line 114 of the first interconnect-level structure L1 and a second contact via structure 109D, as is shown in FIG. 3B. A metal via 215 may electrically contact the upper surface of each of the first metal lines 214 of the second interconnect-level structure L2. The metal vias 215 of the second interconnect-level structure L2 may be laterally offset with respect to the metal vias 115 of the first interconnect-level structure L1 along the second horizontal direction hd2. For example, as shown in FIGS. 3A and 3B, the metal vias 215 may be offset away from the doped well 104 and closer to the source line 112 relative to metal vias 115. Although a single row of first metal lines 214 and corresponding metal vias 215 is shown in FIGS. 3A and 3B, it will be understood that a memory device region 50 may include more than row of first metal lines 214 and metal vias 215, where each row of first metal lines 214 and metal vias 215 may be electrically coupled to the drain regions 109D of underlying transistors 105 located in different rows of the memory device region 50.

Referring to FIGS. 3A-3E, the second interconnect-level structure L2 may further include a plurality of second metal lines 216. Each of the second metal lines 216 may include a strip-shaped portion 221 that may extend continuously along the second horizontal direction hd2. The strip-shaped portions 221 may extend continuously over the memory device region 50 and the doped well 104 and may also extend over additional device regions, such as the second device region 60 as shown in FIG. 3A. Each of the second metal lines 216 may also include at least one protruding portion 220 that may protrude from a side of the strip-shaped portion 221 along the first horizontal direction hd1. Each of the protruding portions 220 may at least partially overlie a third metal line 116 of the first interconnect-level structure L1. Each of the metal vias 117 of the first interconnect-level structure L1 may extend between the upper surface of a third metal line 116 of the first interconnect-level structure L1 and a lower surface of a protruding portion 220 of a second metal line 216 of the second interconnect-level structure L2. Thus, each of the second metal lines 216 of the second interconnect-level structure L2 may be electrically coupled to a pair of gate electrodes 108 the underlying transistors 105 via a metal via 17, a third metal line 116 of the first interconnect-level structure L1 and a pair of third contact via structures 109G, as is shown in FIG. 3C. At least one metal via 217 may electrically contact the upper surface of the strip-shaped portion 221 of each of the second metal lines 221 of the second interconnect-level structure L2. Each metal via 217 may be located adjacent to a protruding portion 220 of the second metal line 221, as is shown in FIGS. 3A and 3C. As is also shown in FIG. 3C, the metal vias 217 and the strip-shaped portions 221 of the second metal lines 216 of the second interconnect-level structure L2 may be laterally offset along the first horizontal direction hd1 from the pair of gate electrodes 108 to which the second metal lines 216 are electrically coupled. In some embodiments, the metal vias 217 and the strip-shaped portions 221 of the second metal lines 216 may each be located in a plane parallel to the second horizontal direction hd2 that also includes a first contact via structure 109G contacting an underlying source region 103S and a fourth contact via structure 109W contacting the doped well 104, as is shown in the vertical cross-section view of FIG. 3D. Thus, the metal vias 217 may be laterally shifted along the first horizontal direction hd1 with respect to the underlying access transistor(s) to which the metal vias 217 are electrically coupled. In some embodiments, the metal vias 217 may be laterally-shifted such that they overlie a periphery of the access transistors, such as the source regions 103S of the access transistors as shown in FIGS. 3C and 3D.

In some embodiments, each of the second metal lines 216 and the metal vias 217 of the second interconnect-level structure L2 may be electrically coupled to gate electrodes 108 of a plurality of access transistors in respective columns of the memory device region 50 extending along the second horizontal direction hd2. Groups of metal vias 217 coupled to different second metal lines 216 may be arranged in rows of metal vias 217 extending along the first horizontal direction hd1. Further, as discussed above, the second metal lines 216 may extend continuously outside of the memory device region 50, such as to the second device region 60 as shown in FIG. 3A.

Referring to FIGS. 3A, 3B and 3E, a plurality of third metal lines 218 of the second interconnect-level structure L2 may extend in a row along the first horizontal direction hd1. In some embodiments, the plurality of third metal lines 116 may extend along a periphery of the memory device region 50 and may overlie the doped well 104. Each of the third metal lines 218 may be laterally surrounded on all sides by the third dielectric material layer 111C. The third metal lines 218 may each have a generally rectangular shape with a dimension along the second horizontal direction hd2 that is greater than a dimension along the first horizontal direction hd1. In some embodiments, the third metal lines 218 may each have the same or similar shape and dimensions as the first metal lines 214, described above. Each of the third metal lines 218 of the second interconnect-level structure L2 may overlie the fourth metal line 118 of the first interconnect-level structures. Each of the metal vias 119 of the first interconnect-level structure L1 may extend between the upper surface of the fourth metal line 118 of the first interconnect-level structure L1 and a lower surface of a third metal line 218 of the second interconnect-level structure L2. Thus, each of the third metal lines 218 of the second interconnect-level structure L2 may be electrically coupled to the doped well 104 via a metal via 119, the fourth metal line 118 of the first interconnect-level structure L1 and the plurality of fourth contact via structure 109W, as is shown in FIG. 3E. A metal via 219 may electrically contact the upper surface of each of the third metal lines 218 of the second interconnect-level structure L2. In some embodiments, each of the metal vias 219 contacting an upper surface of a third metal line 218 may be vertically aligned with a metal via 119 contacting the lower surface of the third metal line 218, as shown in FIG. 3E. Although a single row of third metal lines 218 and metal vias 219 is shown in FIGS. 3A, 3B and 3E, it will be understood that the exemplary intermediate structure in various embodiments may include more than row of third metal lines 218, where each row of third metal lines 218 may be electrically coupled to a doped well region 104.

Referring again to FIGS. 3A-3E, in various embodiments, the first metal lines 214 and the third metal lines 218 of the second interconnect-level structure L2 may be arranged in columns extending along the second horizontal direction hd2. The strip-shaped portions 221 of the second metal lines 216 may extend continuously between adjacent columns. The protruding portions 220 of the second metal lines 216 may extend from the strip-shaped portions 216 along the first horizontal direction hd1 such that at least a portion of the protruding portions 220 may be located between a first metal line 214 and a third metal line 218 within a column.

Figure 4A:
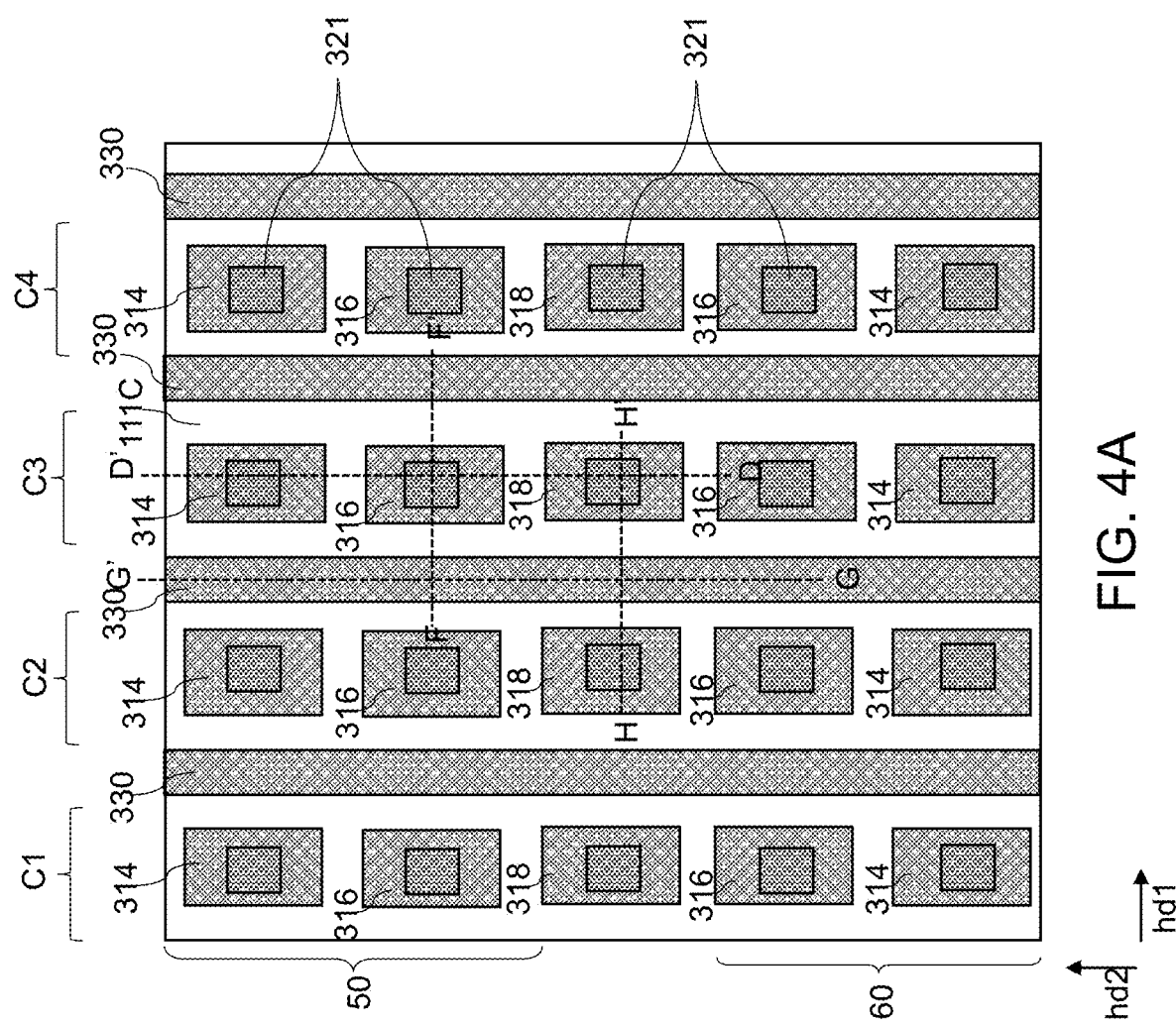
FIG. 4A is a top view of an exemplary intermediate structure during a process of forming a semiconductor IC device including an array of embedded memory elements following the formation of a third interconnect-level structure according to various embodiments of the present disclosure.
Figure 4B:
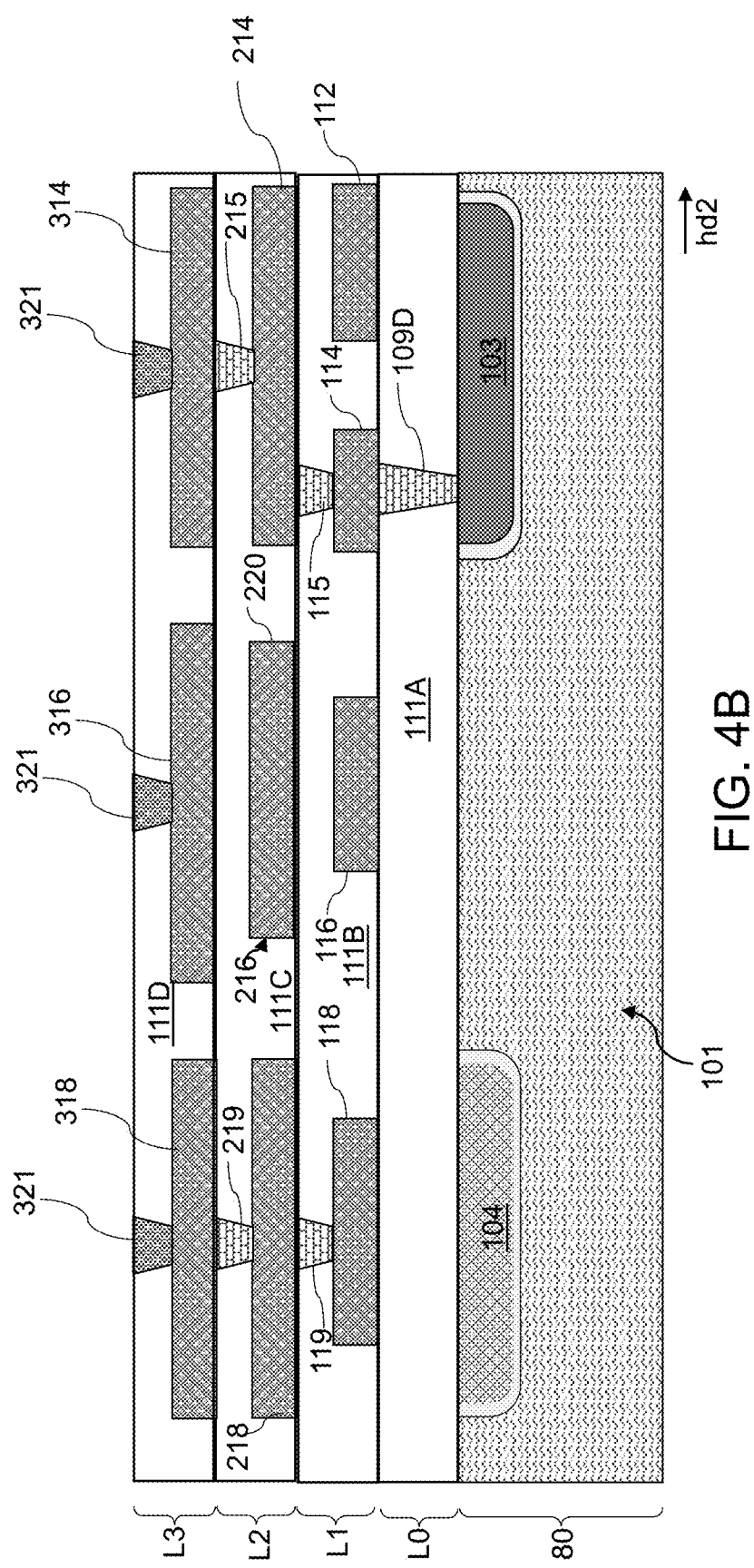
FIG. 4B is a vertical cross-section view of the exemplary intermediate structure along line D-D' in FIG. 4A.
Figure 4C:
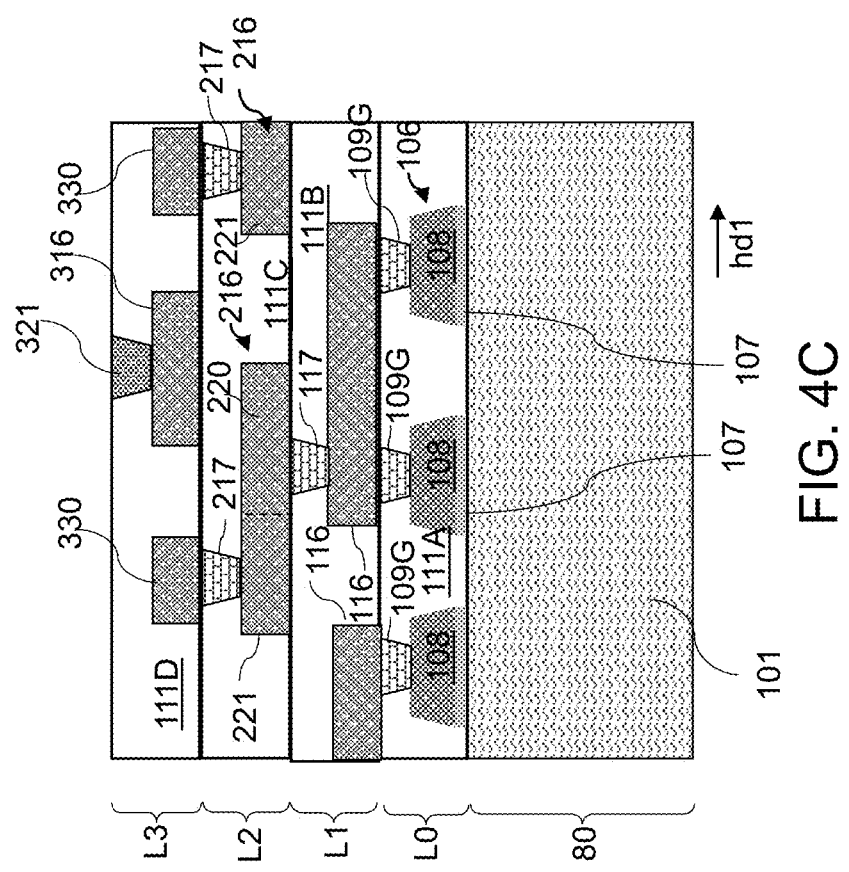
FIG. 4C is a vertical cross-section view of the exemplary intermediate structure along line F-F' in FIG. 4A.
Figure 4D:
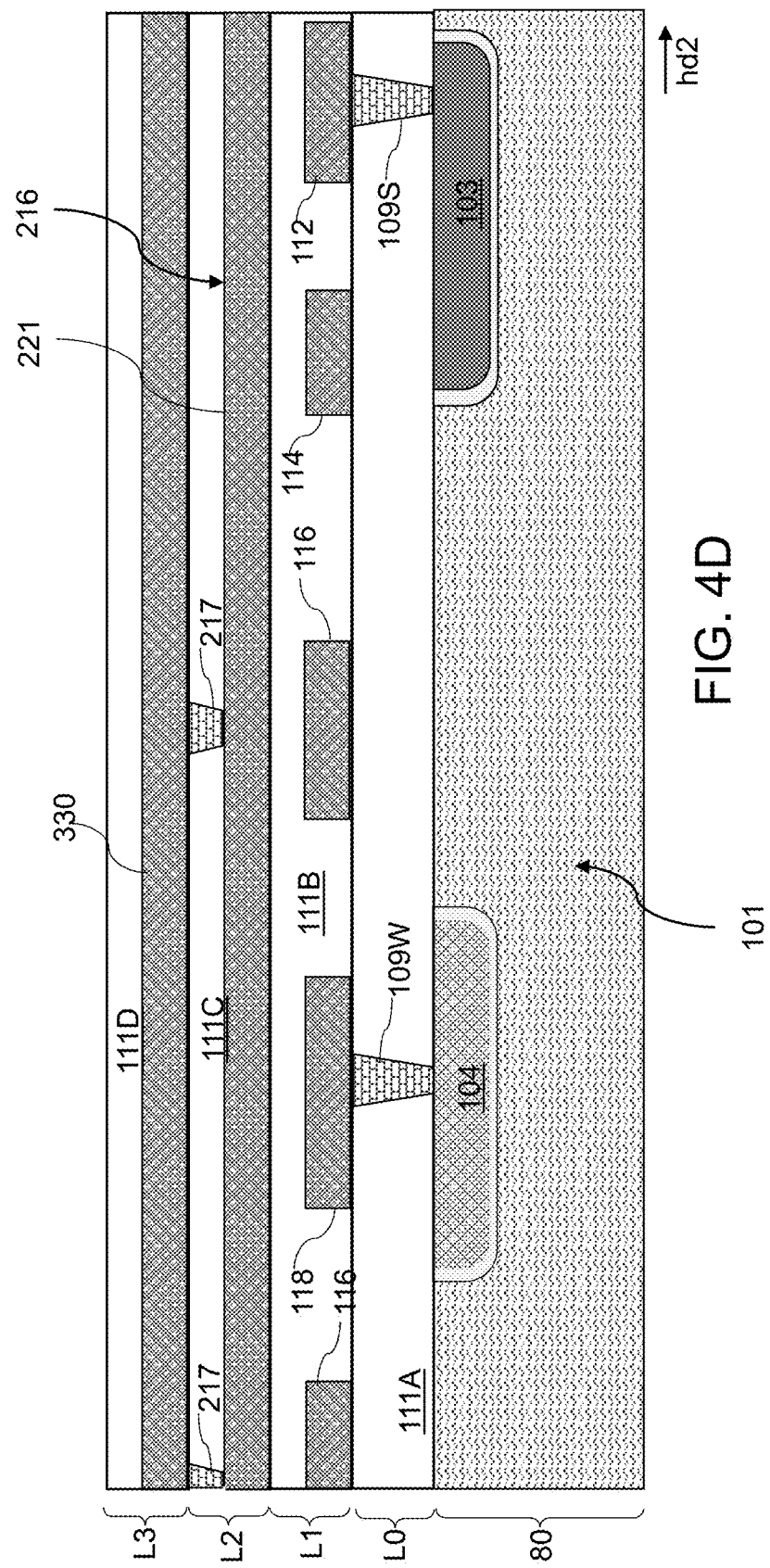
FIG. 4D is a vertical cross-section view of the exemplary intermediate structure along line G-G' in FIG. 4A.
Figure 4E:
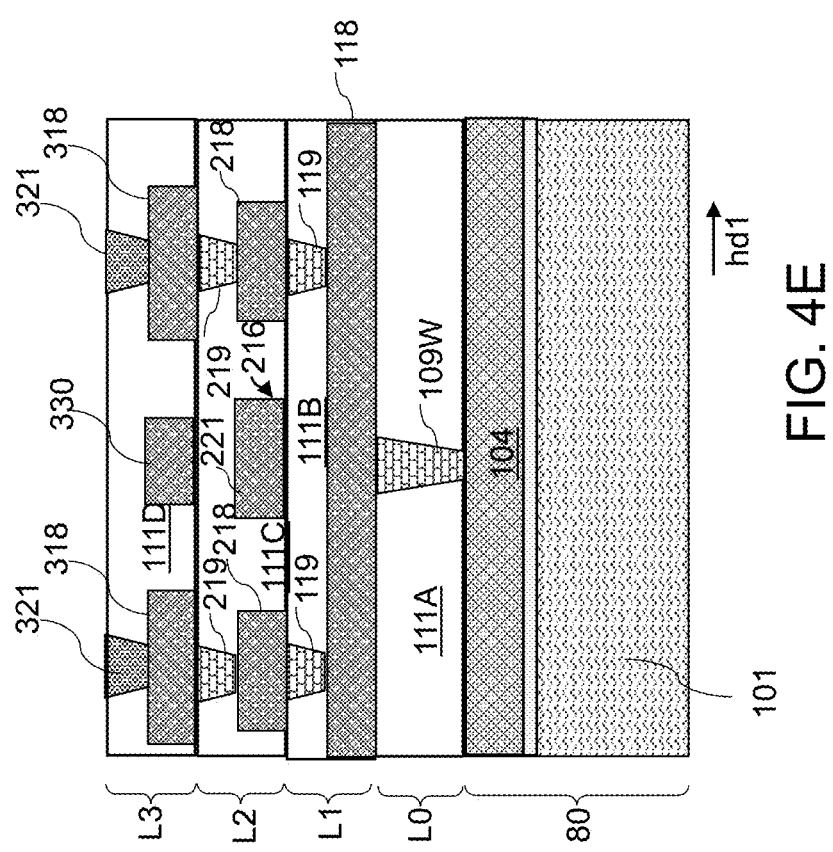
FIG. 4E is a vertical cross-section view of the exemplary intermediate structure along line H-H' in FIG. 4A.

FIG. 4A is a top view of an exemplary intermediate structure during a process of forming a semiconductor IC device including an array of embedded memory elements following the formation of a third interconnect-level structure L3 according to various embodiments of the present disclosure. For sake of illustration, dielectric layer 111D is not shown in FIG. 4A. FIG. 4B is a vertical cross-section view of the exemplary intermediate structure along line D-D' in FIG. 4A. FIG. 4C is a vertical cross-section view of the exemplary intermediate structure along line F-F' in FIG. 4A. FIG. 4D is a vertical cross-section view of the exemplary intermediate structure along line G-G' in FIG. 4A. FIG. 4E is a vertical cross-section view of the exemplary intermediate structure along line H-H' in FIG. 4A.

Referring to FIGS. 4A-4E, a fourth dielectric material layer 111D, third interconnect-level metal lines 314, 316, 318 and 330 and third interconnect-level metal vias 321 may be formed over the upper surface of the second interconnect-level structure L2. For clarity of illustration, the fourth dielectric material layer 111D is not shown in the top view of FIG. 4A. Collectively, the fourth dielectric material layer 111D, the third interconnect-level metal lines 314, 316, 318 and 330 and the third interconnect-level metal vias 321 may form at least a portion of a third interconnect-level structure L3.

The fourth dielectric material layer 111D, the third interconnect-level metal lines 314, 316, 318 and 330 and the third interconnect-level metal vias 321 of the third interconnect-level structure L3 may be formed using the same or equivalent processes and materials as described above for forming the second dielectric layer 111B, the first interconnect-level metal lines 112, 114, 116 and 118 and the first interconnect-level metal vias 115, 117 and 119 of the first interconnect-level structure L1. Thus, repeated discussion of like processes and materials is omitted for brevity.

Referring to FIGS. 4A and 4B, a plurality of first metal lines 314 of the third interconnect-level structure L3 may extend in a row along the first horizontal direction hd1 in the memory device region 50. Each of the first metal lines 314 may be laterally surrounded on all sides by the fourth dielectric material layer 111D. The first metal lines 314 may each have a generally rectangular shape with a dimension along the second horizontal direction hd2 that is greater than a dimension along the first horizontal direction hd1. Each of the first metal lines 314 of the third interconnect-level structure L3 may overlie a corresponding first metal line 214 of the second interconnect-level structure L2. Each of the metal vias 215 of the second interconnect-level structure L2 may extend between the upper surface of a first metal line 214 of the second interconnect-level structure L2 and a lower surface of a first metal line 314 of the third interconnect-level structure L3. Thus, each of the first metal lines 314 of the third interconnect-level structure L3 may be electrically coupled to a drain region 103D of an underlying transistor 105 via a metal via 215 and a first metal line 214 of the second interconnect-level structure L2, a metal via 115 and a second metal line 114 of the first interconnect-level structure L1, and a second contact via structure 109D of the contact-level structure L0, as is shown in FIG. 4B.

Although a single row of first metal lines 314 is shown in FIGS. 4A and 4B, it will be understood that a memory device region 50 may include more than row of first metal lines 314, where each row of first metal lines 314 may be electrically coupled to the drain regions 109D of underlying transistors 105 located in different rows of the memory device region 50.

Referring to FIGS. 4A-4C, a plurality of second metal lines 316 of the third interconnect-level structure L3 may extend in a row along the first horizontal direction hd1 in the memory device region 50. The row of second metal lines 316 may be laterally offset from the row of first metal lines 314 along the second horizontal direction hd2. Each of the second metal lines 316 may be electrically isolated, meaning each of the second metal lines 316 may be surrounded by the fourth dielectric layer 111D around the lateral side surfaces of the second metal lines 316, and each of the second metal lines 316 may be surrounded over by the third dielectric material layer 111C over the lower surfaces of the second metal lines 316. Thus, the second metal lines 316 may not be electrically coupled to any of the underlying metal lines or vias of the underlying second interconnect-level structure L2, the first interconnect-level structure L1, or the contact-level structure L0. In various embodiments, the second metal lines 316 of the third interconnect-level structure L3 may each have a generally rectangular shape with a dimension along the second horizontal direction hd2 that is greater than a dimension along the first horizontal direction hd1. In some embodiments, the shape and dimensions of the second metal lines 316 may be the same as the shape and dimensions of the first metal lines 314. Each of the second metal lines 316 of the third interconnect-level structure L3 may partially overlie a projecting portion 320 of a second metal line 216 of the second interconnect-level structure L2. However, as discussed above, the third metal lines 316 may be electrically isolated from the underlying second metal lines 216 (i.e., no metal vias may electrically couple the second metal lines 216 of the second interconnect-level structure L2 and the second metal lines 316 of the third interconnect-level structure L3).

Although FIGS. 4A-C illustrate a single row of second metal lines 316 within the memory device region 50, it will be understood that a memory device region 50 may include more than row of second metal lines 316, where each row of second metal lines 316 may be electrically isolated from the underlying interconnect structures. In addition, one or more rows of second metal lines 316 may be formed in other regions of the device, such as in the second device region 60 as shown in FIG. 4A.

Referring to FIGS. 4A, 4B and 4E, a plurality of third metal lines 318 of the third interconnect-level structure L3 may extend in a row along the first horizontal direction hd1. In some embodiments, the plurality of third metal lines 318 may extend along a periphery of the memory device region 50 and may overlie the doped well 104. Each of the third metal lines 318 may be laterally surrounded on all sides by the fourth dielectric material layer 111D. The third metal lines 318 may each have a generally rectangular shape with a dimension along the second horizontal direction hd2 that is greater than a dimension along the first horizontal direction hd1. In some embodiments, the third metal lines 318 of the third interconnect-level structure L3 may each have the same or similar shape and dimensions as the first metal lines 314 and the second metal lines 315 of the third interconnect-level structure L3 described above. Each of the third metal lines 318 of the third interconnect-level structure L3 may overlie a third metal line 218 of the second interconnect-level structure L2. Each of the metal vias 219 of the second interconnect-level structure L2 may extend between the upper surface of a third metal line 218 of the second interconnect-level structure L2 and a lower surface of a third metal line 318 of the third interconnect-level structure L3. Thus, each of the third metal lines 318 of the third interconnect-level structure L3 may be electrically coupled to the doped well 104 via a metal via 219 and third metal line 218 of the second interconnect-level structure L2, a metal via 119 and the fourth metal line 118 of the first interconnect-level structure L1, and the plurality of fourth contact via structures 109W of the contact-level structure L0, as is shown in FIG. 4E. Although a single row of third metal lines 318 is shown in FIGS. 4A, 4B and 4C, it will be understood that the exemplary intermediate structure in various embodiments may include more than row of third metal lines 318, where each row of third metal lines 318 may be electrically coupled to a doped well 104.

Referring again to FIGS. 4A and 4B, the first metal lines 314, the second metal lines 316, and the third metal lines 318 of the third interconnect-level structure L3 may be arranged in a plurality of columns C1-C4 extending along the second horizontal direction hd2, where each column C1-C4 may include at least one first metal line 314, at least one second metal line 316, and at least one third metal line 318. In some embodiments, the columns C1-C4 may extend over the memory device region 50, over a doped well 104 along a periphery of the memory device region 50, and may optionally extend into an adjacent region of the exemplary intermediate structure, such as the second device region 60 shown in FIG. 4A. In this example, the second device region 60 includes an additional memory device region. A plurality of metal vias 321 may contact the upper surfaces of each of the first metal lines 314, the second metal lines 316 and the third metal lines 318. Each of the metal vias 321 may contact the bottom surfaces of a memory element to be subsequently formed in the third interconnect-level structure L3 and may function as a lower contact via 321 of a memory cell.

Referring to FIGS. 4A, 4C and 4D, the third interconnect-level structure L3 may also include a plurality of fourth metal lines 330. Each of the fourth metal lines 330 may extend continuously along the second horizontal direction hd2. The fourth metal lines 216 may be located adjacent to and between the respective columns C1-C4 of the first metal lines 314, the second metal lines 316 and the third metal lines 318. The fourth metal lines 330 may extend continuously over the memory device region 50 and the doped well 104 and may also extend over additional device regions, such as the second device region 60 as shown in FIG. 4A. Each of the fourth metal lines 330 of the third interconnect-level structure L3 may overlie a strip-shaped portion 221 of a second metal line 216 of the underlying second interconnect-level structure L2. Each of the metal vias 217 of the second interconnect-level structure L2 may extend between the upper surface of a strip-shaped portion 221 of a second metal line 216 of the second interconnect-level structure L2 and a lower surface of a fourth metal line 330 of the third interconnect-level structure L3. Thus, each of the fourth metal lines 330 of the third interconnect-level structure L3 may be electrically coupled to at least one pair of gate electrodes 108 of the underlying transistors 105 via a metal via 217 and a second metal line 216 of the second interconnect-level structure L2, a metal via 17 and a third metal line 116 of the first interconnect-level structure L1, and a pair of third contact via structures 109G, as is shown in FIG. 4C. Each of the fourth metal lines 330 may be surrounded by the fourth dielectric material layer 111D on the lateral sides surfaces and over the upper surface of the fourth metal line 330. Thus, the fourth metal lines 330 may be electrically isolated from the memory elements that are subsequently formed over the metal vias 321 in the third interconnect-level structure L3 by the fourth dielectric material layer 111D.

In some embodiments, each of the fourth metal lines 330 of the third interconnect-level structure L3 may be electrically coupled to a plurality of gate terminals (e.g., pairs of gate electrodes 108 as shown in FIG. 4C) of access transistors located in a particular column of access transistors extending along the second horizontal direction hd2, either within a single memory device region 50 or over multiple device regions 50, 60 of the exemplary intermediate structure. The fourth metal lines 330 may also be referred to as "word lines" 330 of the memory array(s) to be subsequently formed.

Figure 5A:
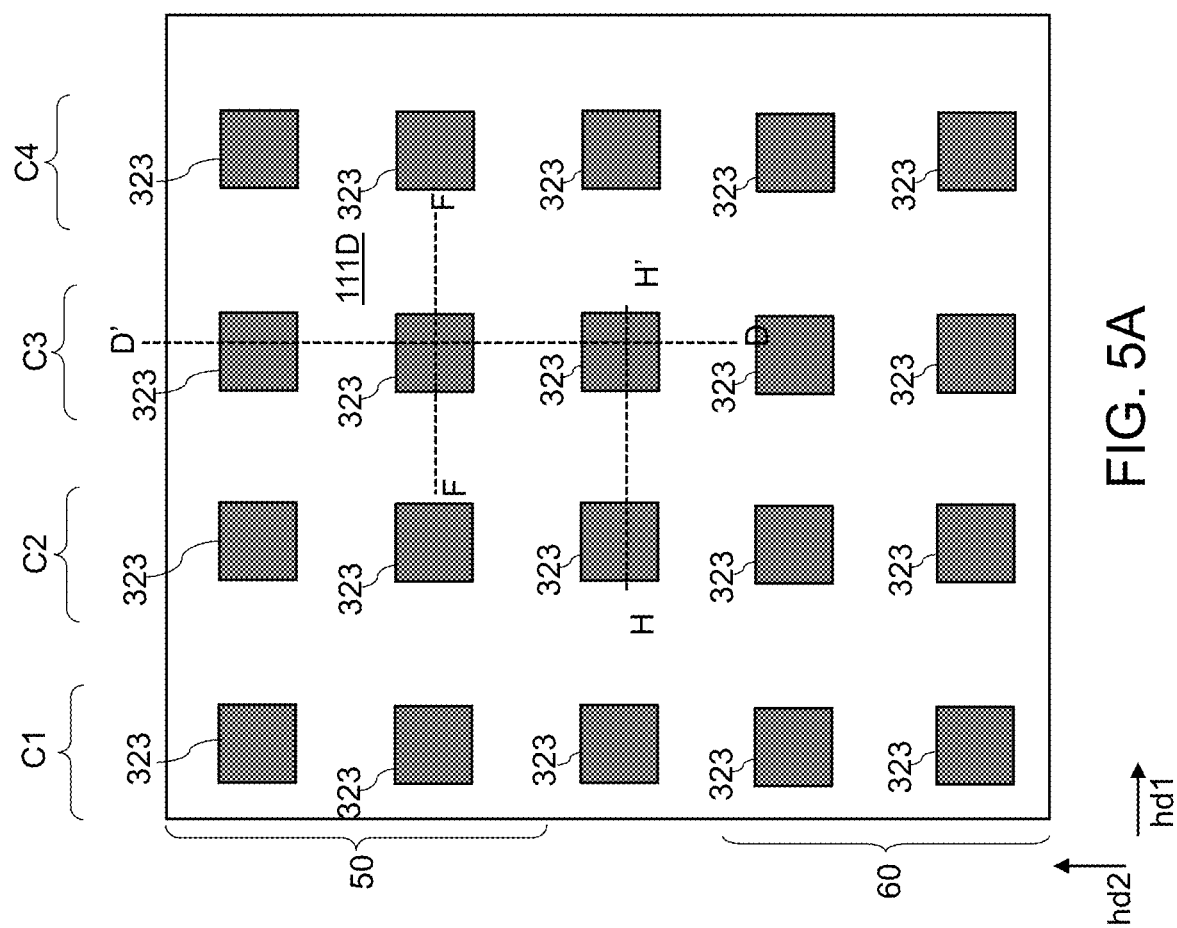
FIG. 5A is a top view of an exemplary intermediate structure during a process of forming a semiconductor IC device illustrating an array of memory elements formed over the metal vias in the third interconnect-level structure according to various embodiments of the present disclosure.
Figure 5B:
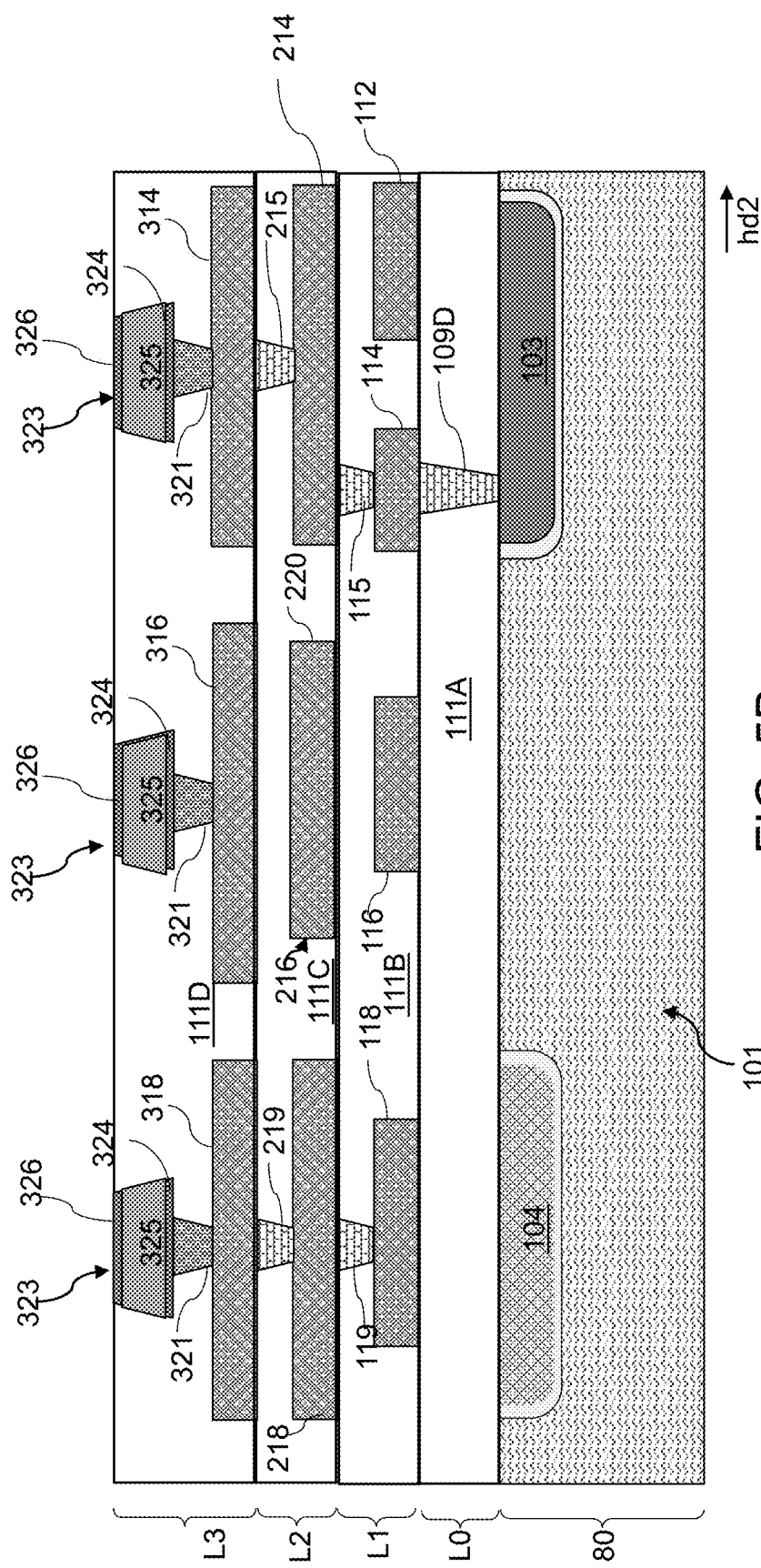
FIG. 5B is a vertical cross-section view of the exemplary intermediate structure along line D-D' in FIG. 5A.
Figure 5C:
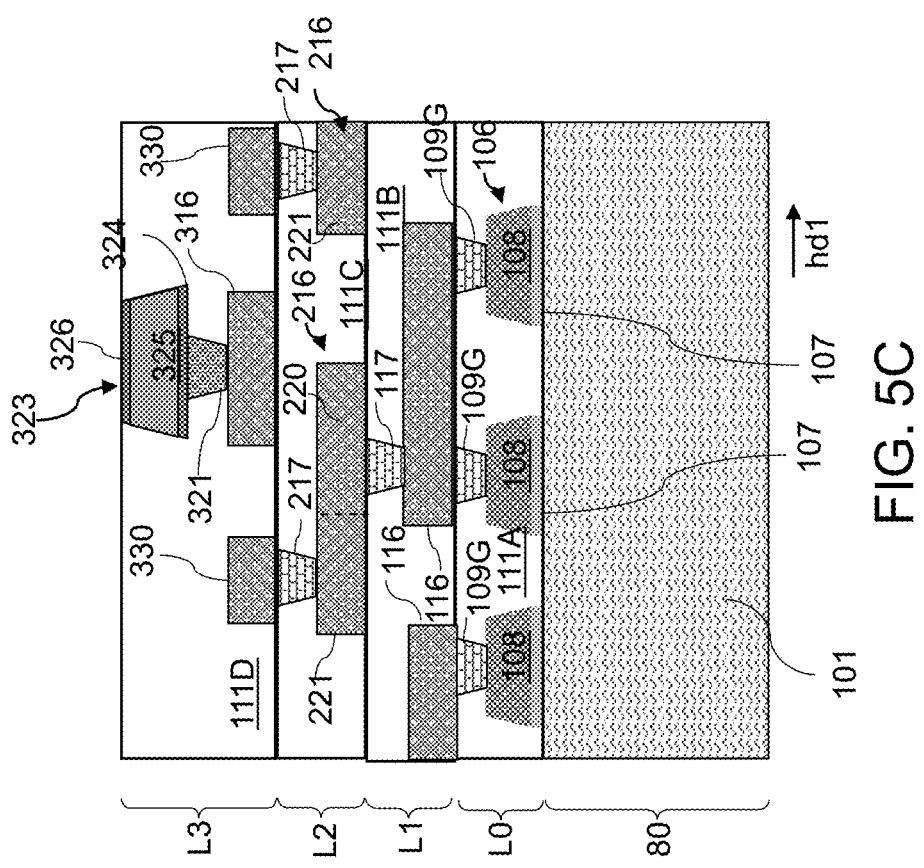
FIG. 5C is a vertical cross-section view of the exemplary intermediate structure along line F-F' in FIG. 5A.
Figure 5D:
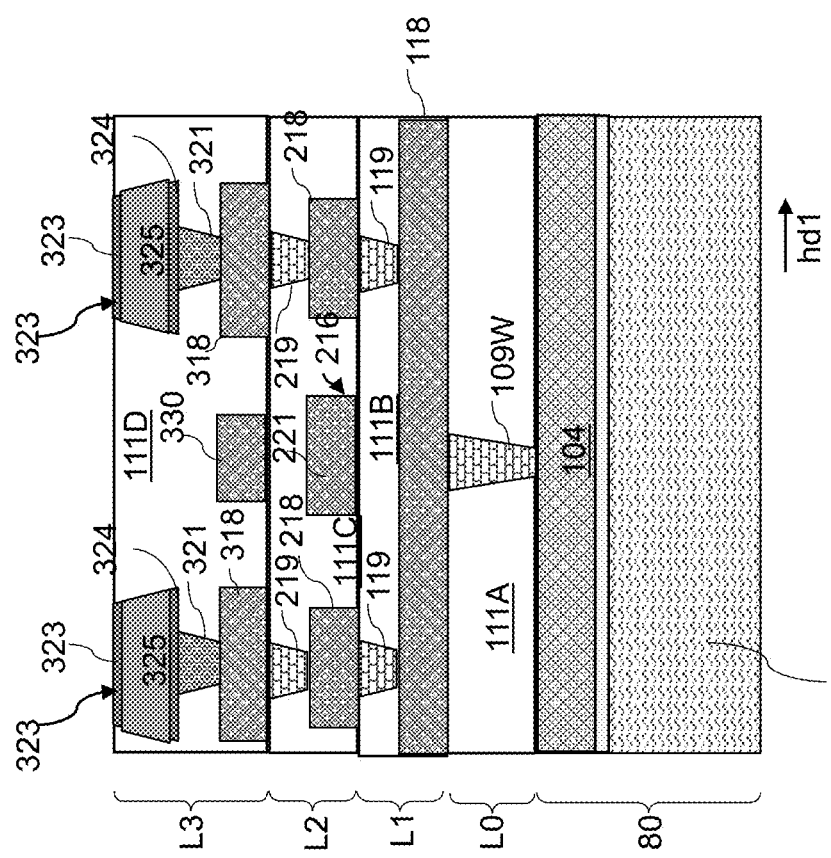
FIG. 5D is a vertical cross-section view of the exemplary intermediate structure along line H-H' in FIG. 5A.

FIG. 5A is a top view of an exemplary intermediate structure during a process of forming a semiconductor IC device illustrating an array of memory elements 323 formed over the metal vias 321 in the third interconnect-level structure L3 according to various embodiments of the present disclosure. FIG. 5B is a vertical cross-section view of the exemplary intermediate structure along line D-D' in FIG. 5A. FIG. 5C is a vertical cross-section view of the exemplary intermediate structure along line F-F' in FIG. 5A. FIG. 5D is a vertical cross-section view of the exemplary intermediate structure along line H-H' in FIG. 5A.

Referring to FIGS. 5A-5D, each of the memory elements 323 may include a structure that is configured to store data, which may include a logic state of each of the memory elements 323. In various embodiments, the memory elements 323 may be non-volatile, meaning they will retain their programmed logic state in the absence of applied power for a prolonged time period, such as greater than 24 hours. The memory elements 323 may also be re-programmable, meaning that the logic state that is stored by each of the memory elements 323 may be switched (e.g., from stored data value of "0" to a stored data value of "1", and vice versa) under suitable programming conditions.

In some embodiments, the memory elements 323 may each include a memory material layer 325. The memory material layer 325 may be located between a pair of electrodes, including a bottom electrode 324 that may electrically contact a metal via 321 of the third interconnect-level structure L3 and a top electrode 326 over an upper surface of the memory material layer 325.

In embodiments in which the memory elements 323 include magnetoresistive random-access memory (MRAM) memory elements, the memory material layer 325 may include a layer stack including a magnetic tunnel junction (MTJ) structure. The MTJ structure may include a lower MTJ layer, an upper MTJ layer, and a spacer layer, such as a nonmagnetic tunnel barrier layer, located between the lower MTJ layer and the upper MTJ layer. A first one of the lower MTJ layer and the upper MTJ layer may include a "reference" layer having a fixed magnetization direction, and the second one of the lower MTJ layer and the upper MTJ layer may include a "free" layer having two stable magnetization directions that are parallel or antiparallel to the magnetization direction of the reference layer. The magnetization direction of the free layer may be changed between the two stable magnetization directions by the application of a suitable current and/or voltage signal across the MRAM memory element 323. The electrical resistance through the MRAM memory element 323 may vary based on the magnetization direction of the free layer relative to the (fixed) magnetization direction of the reference layer. When the magnetization directions of the reference layer and the free layer are parallel, the MRAM memory element 323 may be in a Low Resistance State (LRS). When the magnetization directions of the reference layer and the free layer are antiparallel, the MRAM memory element 323 may be in a High Resistance State (HRS).

Thus, individual MRAM memory elements 323 be programmed by changing the memory element from a High Resistance State (HRS) to a Low Resistance State (LRS), or vice versa. During a read operation, a low voltage may be applied to the memory elements, and the logic state of each memory element may be determined based on the current flow through the memory element. A relatively higher current flow indicates that the memory element has a Low Resistance State (LRS), while a relatively lower current flow indicates that the memory element has a High Resistance State (HRS). In some embodiments, the high current flow (i.e., LRS) may indicate a stored data value of "1", while a low current flow (i.e., HRS) may indicate a stored data value of "0".

In some embodiments, the lower MTJ layer may include an optional metallic seed layer, a hard ferromagnetic layer, an antiferromagnetic coupling layer, and the reference layer, and the upper MTJ layer may include the free layer and an optional capping layer. Alternatively, the lower MTJ layer may include an optional capping layer and the free layer, and the upper MTJ layer may include a reference layer, an antiferromagnetic coupling layer, and a hard ferromagnetic layer. The optional metallic seed layer may include a polycrystalline nonmagnetic metallic material, such as Ti, a CoFeB alloy, a NiFe alloy, ruthenium, or a combination thereof. Other suitable materials for the optional metallic seed layer are within the contemplated scope of disclosure. The hard ferromagnetic layer may include a ferromagnetic material such as CoFe, Co, Pt, CoPt, Pd, CoPd, Ni, CoNi, Ru, Ir, PtMn, IrMn, RhMn, FeMn, or OsMn; a bilayer stack of Co/Pt, Co/Pd or Co/Ni; or a combination or a multilayer stack thereof. Other suitable materials for the hard ferromagnetic layer are within the contemplated scope of disclosure. The antiferromagnetic coupling layer may include a suitable antiferromagnetic coupling material such as ruthenium, iridium, or chromium. Other suitable materials for the antiferromagnetic coupling material are within the contemplated scope of disclosure. The reference layer may include a ferromagnetic material, such as Ta, Mo W, CoFeB, FeB, Co, Fe, CoFe, CoFeTa, NiFe, CoPt, CoFeNi, or the like, that has a fixed magnetization direction that is antiferromagnetically coupled to the fixed magnetization direction of the hard ferromagnetic layer. Other suitable materials for the reference layer are within the contemplated scope of disclosure. The nonmagnetic tunnel barrier layer may include an electrically insulating material having a thickness that allows electron tunneling through the nonmagnetic barrier layer. Suitable materials for the nonmagnetic tunnel barrier layer may include, for example, magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). Other materials for the nonmagnetic tunnel barrier layer are within the contemplated scope of disclosure. The free layer may include a ferromagnetic material, such as CoFeB, FeB, Co, Fe, CoFe, CoFeTa, NiFe, CoPt, CoFeNi, or the like, that has two stable magnetization directions that are parallel or antiparallel to the magnetization direction of the reference layer. Other suitable materials for the free layer are within the contemplated scope of disclosure. The optional capping layer may include a suitable capping material such as Mg, Al, Ti, Ta, W, Ge, Pt, Ru, Cu, Mo, Ta, Zr, Nb, Cr, ZrN, TiN, MoN, magnesium oxide (MgO), aluminum oxide ($Al_2O_3$), aluminum nitride (AlN), aluminum oxynitride (AlON), hafnium oxide ($HfO_2$) and/or zirconium oxide ($ZrO_2$). Other suitable materials for the capping layer are within the contemplated scope of disclosure. The top and bottom electrodes 324 and 326 may be composed of a suitable nonmagnetic metallic material, such as TiN, TaN, WN, W, Cu, Al, Ti, Ta, Ru, Co, Mo, Pt, an alloy thereof, and/or a combination thereof. Other suitable materials for the top and bottom electrodes 324 and 326 are within the contemplated scope of disclosure.

In embodiments in which the memory elements 323 include resistive random-access memory (RRAM) memory elements, the memory material layer 325 may include a switching layer (which may also be referred to as a "storage layer"). The switching layer may include a solid-state dielectric material that may be switchable between a stable High Resistance State (HRS) and a stable Low Resistance State (LRS) under suitable programming conditions. In some embodiments, the switching layer may be switched to an LRS by the application of a voltage pulse that is configured to promote the formation of conductive paths or "filaments" through the switching layer, and the switching layer may be switched to an HRS state by the application of a voltage pulse that is configured to break the conductive filaments through the switching layer. Suitable materials for the switching layer may include, for example, a dielectric material, a metal oxide and/or a high-k material, such as titanium dioxide ($TiO_2$), hafnium dioxide ($HFO_2$), hafnium-aluminum-dioxide ($HF_xAl_{1-x}O_2$), tantalum pentoxide ($Ta_2O_5$), tungsten dioxide ($WO_2$), zirconium dioxide ($ZrO_2$), hafnium zirconium oxide ($Hf_xZr_{1-x}O_2$, where $0.1 \le x \le 0.9$), aluminum oxide ($Al_2O_3$), nickel oxide (NiO), zinc oxide (ZnO) and silicon oxide ($SiO_2$). Other suitable materials having a resistive switching property are within the contemplated scope of disclosure.

In embodiments in which the memory elements 323 include conductive bridge random-access memory (CBRAM) memory elements, the memory material layer 325 may include a switching layer composed of an electrolyte material. One of the electrodes 324, 326 contacting the memory material layer 325 may be composed of an electrochemically inert metallic material, such as Pt, W, Au, Ti, TiN, TaN, and the other electrode 326, 324 contacting the memory material layer 325 may be composed of an electrochemically active metallic material, such as Ag, Cu, $Zr_xTe_{1-x}$, and the like. The switching layer may include an electrolyte material that enables diffusion of metal ions from the electrochemically active electrode through the switching layer. Suitable materials for the switching layer may include, for example, metal oxide materials (e.g., $HfO_2$, $SiO_2$, $Ta_2O_5$, $Al_2O_3$, $TiO_2$, etc.), chalcogenides (e.g., GeSe, GeS, GeTe, etc.), 2D materials such as black phosphorus and hexagonal boron nitride, and organic materials. Other suitable materials for the switching layer and the electrodes 324 and 326 are within the contemplated scope of disclosure. The switching layer may be switchable between a stable High Resistance State (HRS) and a stable Low Resistance State (LRS) under suitable programming conditions which are configured to cause either the formation of, or the dissolution of, conductive filaments through the electrolyte via an electrochemical process.

In embodiments in which the memory elements 323 include ferroelectric random access memory (FeRAM) memory elements, the memory material layer 325 may include a layer of ferroelectric material. A ferroelectric material is a material that may have spontaneous nonzero electrical polarization (i.e., non-zero total electrical dipole moment) when the external electrical field is zero. The spontaneous electrical polarization may be reversed by a strong external electric field applied in the opposite direction. The memory material layer 325 including the layer of ferroelectric material and the top and bottom electrodes 324 and 326 of the memory element 323 may form a capacitor, where the bottom electrode 324 of the capacitor may be electrically coupled to a node of an underlying access transistor. The polarization state of the layer of ferroelectric material may be used to encode the logic state of the FeRAM memory element 323. The FeRAM memory element 323 may be programmed by applying an electric charge to the electrodes 324 and 326 that causes the layer of ferroelectric material to become polarized in one of two stable remnant polarization states. To read the logic state of a FeRAM memory element 323, the access transistor may force the layer of ferroelectric material of the FeRAM memory element 323 into a predetermined logic state (e.g., a "0" logic state) and the current on an output line of the FeRAM memory element 323 may be sensed. In the case where the FeRAM memory element 323 was already programmed to have the predetermined logic state (e.g., a "0" logic state), no current is sensed on the output line, thereby indicating that the memory element 323 was programmed to have the predetermined logic state. However, in the case where the memory element 323 was programmed to have the opposite logic state (e.g., a "1" logic state), the reversal of the polarization state of the layer of ferroelectric material causes a short current pulse to flow on the output line of the memory element 323. The sensing of this current pulse indicates that the memory element 323 was programmed to have the opposite logic state from the predetermined logic state (e.g., a "1" logic state). Suitable ferroelectric materials for a FeRAM memory element 323 may include, without limitation, $Hf_xZr_{1-x}O_y$ where $0 \le x \le 1$ and $y > 0$, $HfO_2$, HfSiO, HfLaO, $ZrO_2$, $PbZrO_3$, $Pb[Zr_xTi_{1-x}]O_3$, $(0 \le x \le 1)$ (PZT), $Pb_{1-x}La_xZr_{1-y}Ti_yO_3$ (PLZT), $BaTiO_3$, $PbTiO_3$, $PbNb_2O_6$, $LiNbO_3$, $LiTaO_3$, $PbMg_{1/3}Nb_{2/3}O_3$ (PMN), $PbSc_{1/2}Ta_{1/2}O_3$ (PST), $SrBi_2Ta_2O_9$ (SBT), $Bi_{1/2}Na_{1/2}TiO_3$, and combinations thereof. Other suitable ferroelectric materials are within the contemplated scope of disclosure.

Referring again to FIGS. 5A-5E, in various embodiments, the array of memory elements 323 may be formed by depositing a continuous bottom electrode layer 324 over the upper surface of the fourth dielectric material layer 111D and the plurality of metal vias 321 using a suitable deposition process as described above. A continuous memory material layer 325 may then be deposited over the upper surface of the continuous bottom electrode layer 324 using one or more suitable deposition processes as described above. A continuous top electrode layer 326 may then be deposited over the upper surface of the continuous memory material layer 325 using a suitable deposition process. The continuous top electrode layer 326, the continuous memory material layer 325, and the continuous bottom electrode layer 324 may be subsequently patterned, for example, by applying and patterning a photoresist layer over continuous top electrode layer 326, and by anisotropically etching unmasked portions of the continuous top electrode layer 326, the continuous memory material layer 325, and the continuous bottom electrode layer 324 to form a plurality of discrete memory elements 323 as shown in FIGS. 5A-5E. Additional dielectric material may be deposited over the upper surface of the fourth dielectric material layer 111D and over the upper surface and side surfaces of the memory elements 323. A planarization process, such as a CMP process, may be used to remove dielectric material from over the upper surfaces of the memory elements 323 such that the upper surfaces of the memory elements 323 may be substantially co-planar with the upper surface of the fourth dielectric material layer 111D.

As discussed above, processes used to form the array of memory elements 323, such as plasma-assisted material deposition processes and/or plasma-assisted etching processes, may produce an accumulation of charged particles (e.g., electrons) on the in-progress semiconductor IC device. Electrically conductive structures (e.g., metal lines and vias) in the interconnect-level structures L1-L3 and the contact-level structure L0 may provide low-resistance pathways for the accumulated plasma charge to travel down to the underlying substrate 80. However, in many cases, the plasma charge may accumulate in regions of relatively higher resistance, such as at the active regions (e.g., the drain regions 103D) and the gate dielectric layers 107 of the transistors 105, which may result in plasma induced damage (PID) to the transistors 105.

Various embodiments of the present disclosure address the issue of plasma induced damage (PID) to the underlying transistors 105 by providing a low resistance pathway for plasma charge to reach a doped well 104 formed in the semiconductor material layer 101 of the substrate 80. In various embodiments, a plurality of conductive interconnect structures, including metal lines and vias, may extend continuously between the interconnect-level structure (e.g., the third interconnect-level structure L3 in the embodiment of FIGS. 5A-5E) in which the memory elements 323 are formed and the doped well 104 formed in the semiconductor material layer 101 of the substrate 80. As shown in FIG. 5D, for example, plasma charge generated during the fabrication of the memory elements 323 may travel through the metal vias 321 and third metal lines 318 of the third interconnect-level structure L3, the metal vias 219 and third metal lines 218 of the second interconnect-level structure L2, the metal vias 119 and the fourth metal line 118 of the first interconnect-level structure L1, and the fourth contact via structures 109W of the contact-level structure L0 to reach the doped well 104. The doped well 104 may provide a relatively low contact resistance such that charged particles may easily flow into the doped well 104. Thus, by providing a relatively lower resistance pathway through the interconnect-level structures and the contact-level structure to the doped well 104, a large portion of the plasma charge generated during the fabrication of the memory elements 323 may flow to the doped well 104 rather than to the device structures (e.g., transistors 105) formed on the substrate 80.

Further, because the word lines 330 and the underlying conductive interconnect structures that couple the word lines 330 to the gate electrodes 108 of the transistors 105 are electrically isolated from the memory elements 323 by the fourth dielectric material layer 111D, the amount of plasma charge that travels to the gate structures 106 of the transistors 105 may be minimized. This may help to protect the transistors 105, including the gate dielectric layers 107 of the transistors 105, from plasma induced damage.

Figure 6A:
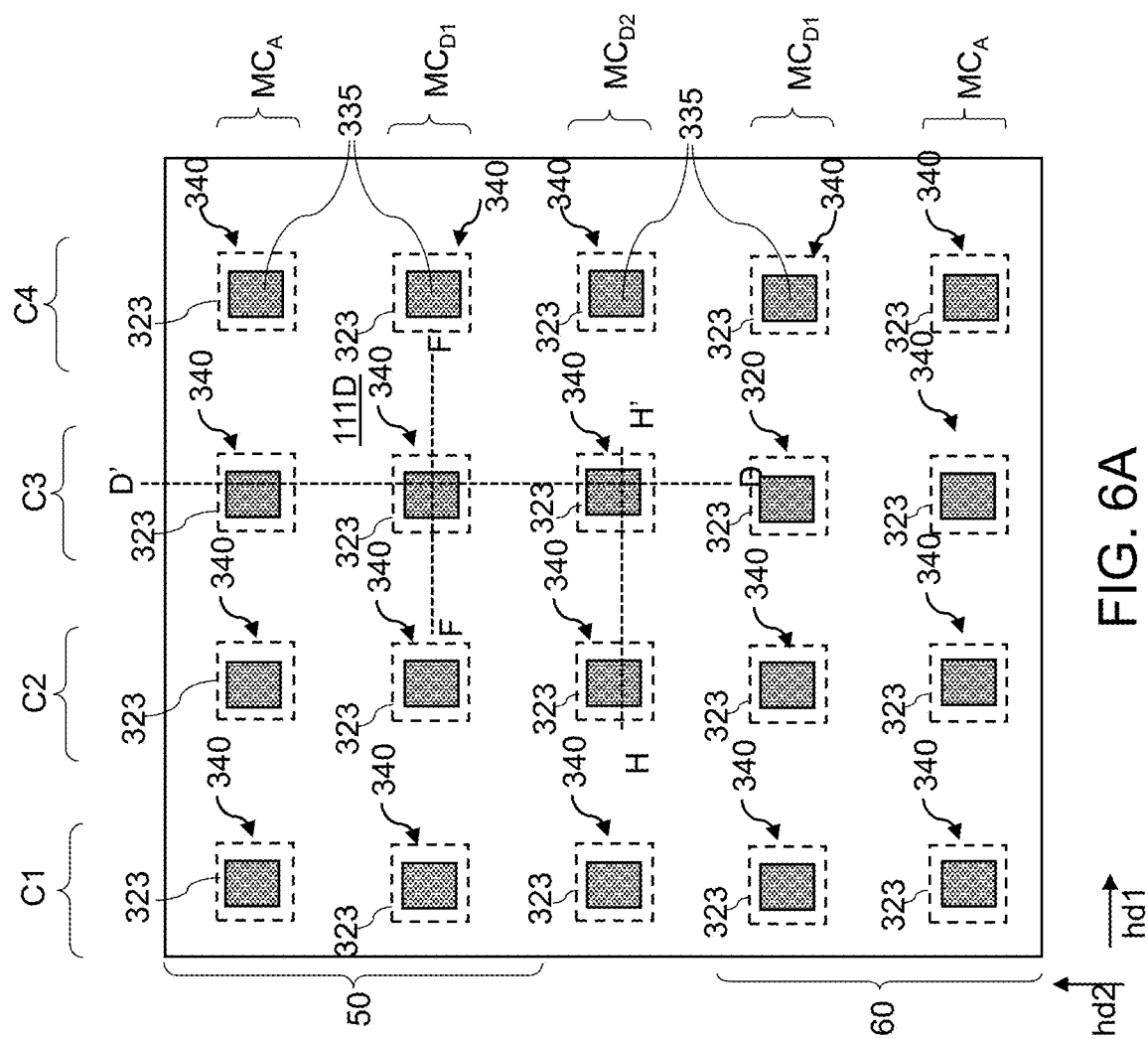
FIG. 6A is a top view of an exemplary intermediate structure during a process of forming a semiconductor IC device illustrating an array of memory cells formed in the third interconnect-level structure according to various embodiments of the present disclosure.
Figure 6B:
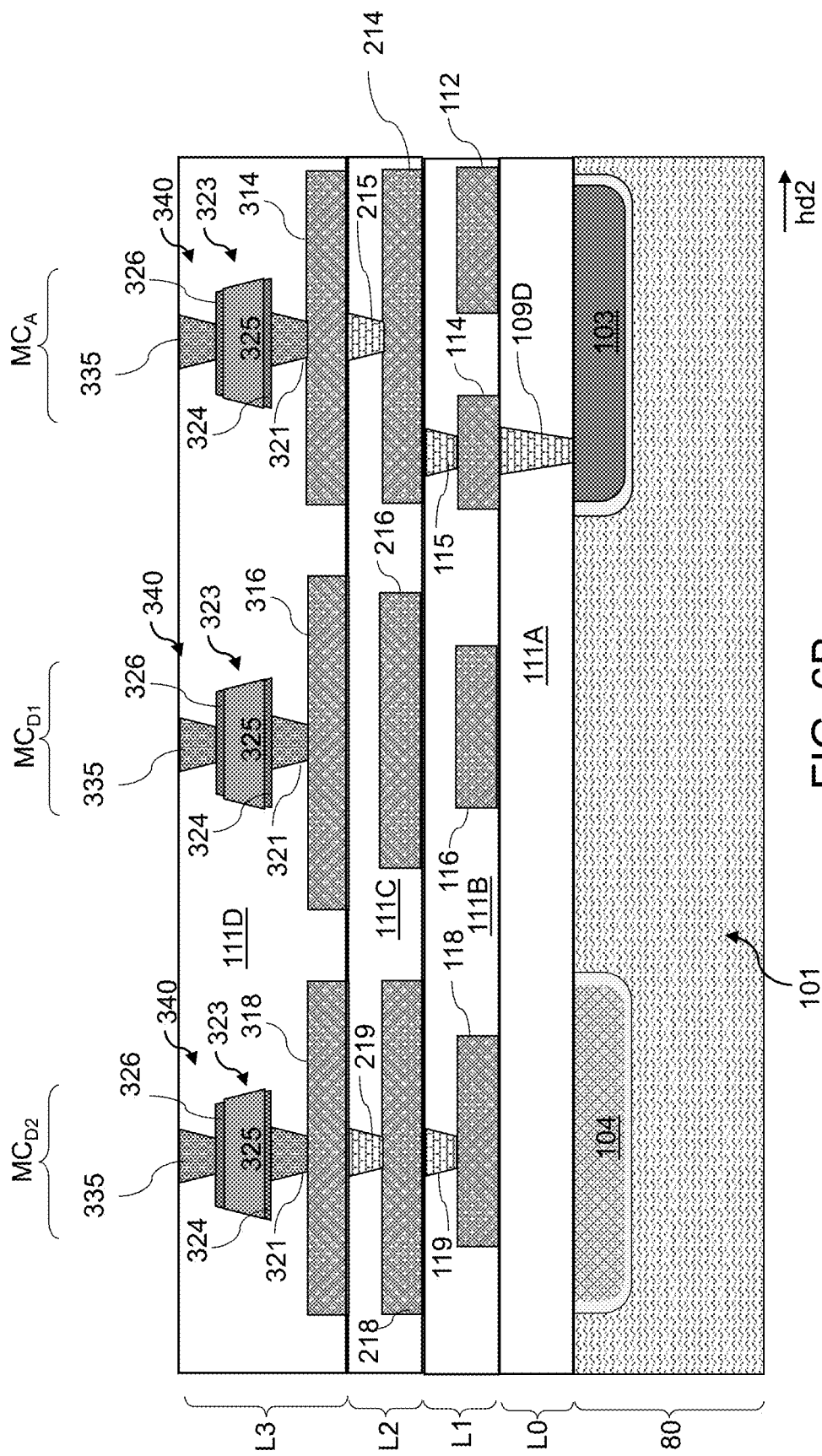
FIG. 6B is a vertical cross-section view of the exemplary intermediate structure along line D-D' in FIG. 6A.
Figure 6C:
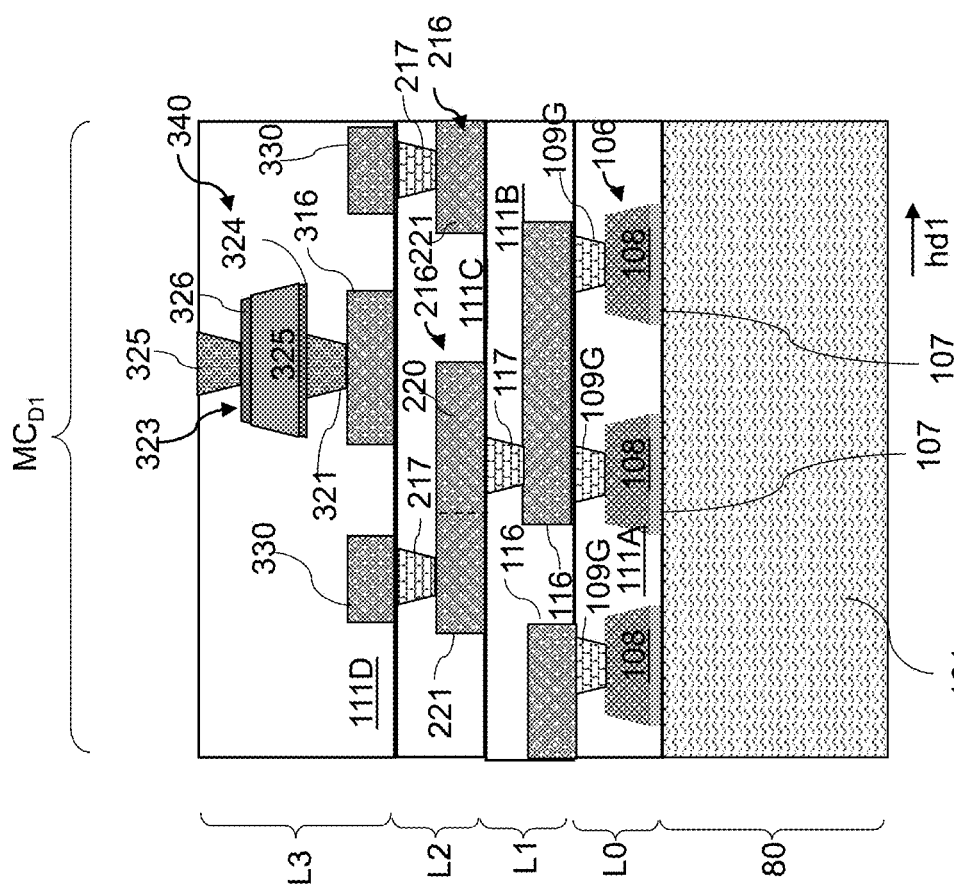
FIG. 6C is a vertical cross-section view of the exemplary intermediate structure along line F-F' in FIG. 6A.
Figure 6D:
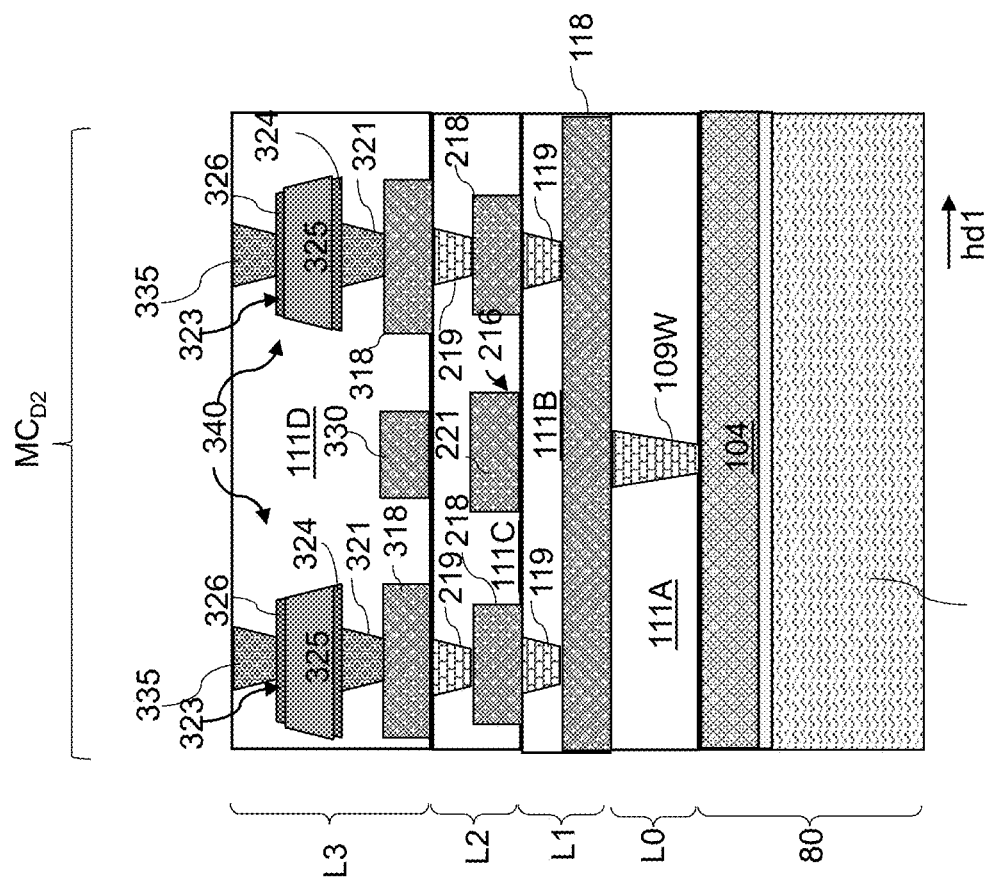
FIG. 6D is a vertical cross-section view of the exemplary intermediate structure along line H-H' in FIG. 6A.

FIG. 6A is a top view of an exemplary intermediate structure during a process of forming a semiconductor IC device illustrating an array of memory cells 340 formed in the third interconnect-level structure L3 according to various embodiments of the present disclosure. FIG. 6B is a vertical cross-section view of the exemplary intermediate structure along line D-D' in FIG. 6A. FIG. 6C is a vertical cross-section view of the exemplary intermediate structure along line F-F' in FIG. 6A. FIG. 6D is a vertical cross-section view of the exemplary intermediate structure along line H-H' in FIG. 6A.

Referring to FIGS. 6A-6D, a plurality of upper contact vias 335 may be formed in the fourth dielectric material layer 111D. Each upper contact via 335 may contact an upper surface of a respective memory element 323. The plurality of upper contact vias 335 may be formed by depositing additional dielectric material over the upper surface of the fourth dielectric material layer 111D and the upper surfaces of the memory elements 323 such that fourth dielectric material layer 111D may cover each of the memory elements 323. The fourth dielectric material layer 111D may then be patterned, for example, by applying and patterning a photoresist layer over the fourth dielectric material layer 111D and by anisotropic ally etching unmasked portions of the fourth dielectric material layer 111D to form a plurality of via openings in the dielectric material layer 111D. An upper surface of a memory element 323 may be exposed at the bottom of each via opening. A conductive material may then be deposited in the via openings using a suitable deposition process as described above. A planarization process, such as a CMP process, may be used to remove conductive material from over the upper surface of the fourth dielectric material layer 111D and provide a plurality of upper contact vias 335 contacting the memory elements 323.

Referring again to FIG. 6A-6D, the exemplary intermediate structure may include an array of embedded memory cells 340 in the third interconnect-level structure L3, each memory cell 340 including a memory element 326 located between a lower contact via 321 and an upper contact via 335. The memory cells 340 may be arranged in a periodic two-dimensional array (e.g., a rectangular array) including rows of memory cells 340 extending along a first horizontal direction hd1 and columns of memory cells 340 extending along a second horizontal direction hd2. The array may include at least one row of active memory cells $MC_A$ and at least one row of dummy memory cells $MC_{D1}$, $MC_{D2}$. Each column may include at least one instance of an active memory cell $MC_A$ and at least one instance of a dummy memory cell $MC_{D1}$, $MC_{D2}$. As used herein, an "active" memory cell $MC_A$ refers to a memory cell 340 that is electrically coupled to a node of an access transistor that is configured to control a programming operation, an erase operation, and/or a sensing (read) operation of the memory cell 340. A "dummy" memory cell $MC_{D1}$, $MC_{D2}$ refers to a memory cell 340 that is not electrically coupled to a node of an access transistor or is otherwise non-functional with respect to the programming, erasing, and/or or reading of data (e.g., bits).

In the embodiment of FIGS. 6A-6D, each memory device region 50 may include at least one row of active memory cells $MC_A$ electrically coupled to respective drain regions 103D of underlying access transistors via conductive interconnect structures, as is shown in FIG. 6B. Although the embodiment of FIGS. 6A-6D shows a single row of active memory cells $MC_A$ in the memory device region 50, it will be understood that the memory device region 50 in various embodiments may include more than one row of active memory cells $MC_A$. Further the exemplary structure may also include additional memory device regions, such as device region 60 shown in FIG. 6A, where each memory device region may include at least one row of active memory cells $MC_A$.

In various embodiments, each memory device region 50 may further include a row of dummy memory cells $MC_{D1}$ that are electrically isolated, meaning that the dummy memory cells $MC_{D1}$ are not electrically coupled to the underlying substrate 80 or to any devices formed on or in the substrate 80 (e.g., transistors 105) via conductive interconnect structures. As shown in FIGS. 6B and 6C, for example, the memory cells 340 in the row labeled $MC_{D1}$ are connected to second metal lines 316 of the third interconnect-level structure L3 via lower contact vias 321. However, the second metal lines 316 are themselves electrically isolated from the lower interconnect-level structures and are thus electrically isolated from the underlying substrate 80 and transistors 105 formed thereon. Although the embodiment of FIGS. 6A-6D shows a single row of dummy memory cells $MC_{D1}$ in the memory device region 50, it will be understood that the memory device region 50 in various embodiments may include more than one row of dummy memory cells $MC_{D1}$. Further the exemplary structure may also include additional memory device regions, such as device region 60 shown in FIG. 6A, where each memory device region may include at least one row of dummy memory cells $MC_{D1}$.

In various embodiments, a row of dummy memory cells $MC_{D2}$ may extend along a periphery of the memory device region 50. The row of dummy memory cells $MC_{D2}$ may be located over the doped well 104 in the semiconductor material layer 101 of the substrate 80, as shown in FIGS. 6B and 6D. Each of dummy memory cells $MC_{D2}$ may be electrically coupled to the doped well 104 via conductive interconnect structures, as is shown in FIG. 6D. Although a single row of dummy memory cells $MC_{D2}$ is shown in the embodiment of FIGS. 6A-6D, it will be understood that the exemplary structure may include a plurality of rows of dummy memory cells $MC_{D2}$, such as between adjacent device regions 50 and 60 as shown in FIG. 6A. Each memory cell 340 of the rows of dummy memory cells $MC_{D2}$ may be coupled to a doped well 104.

Figure 7B:
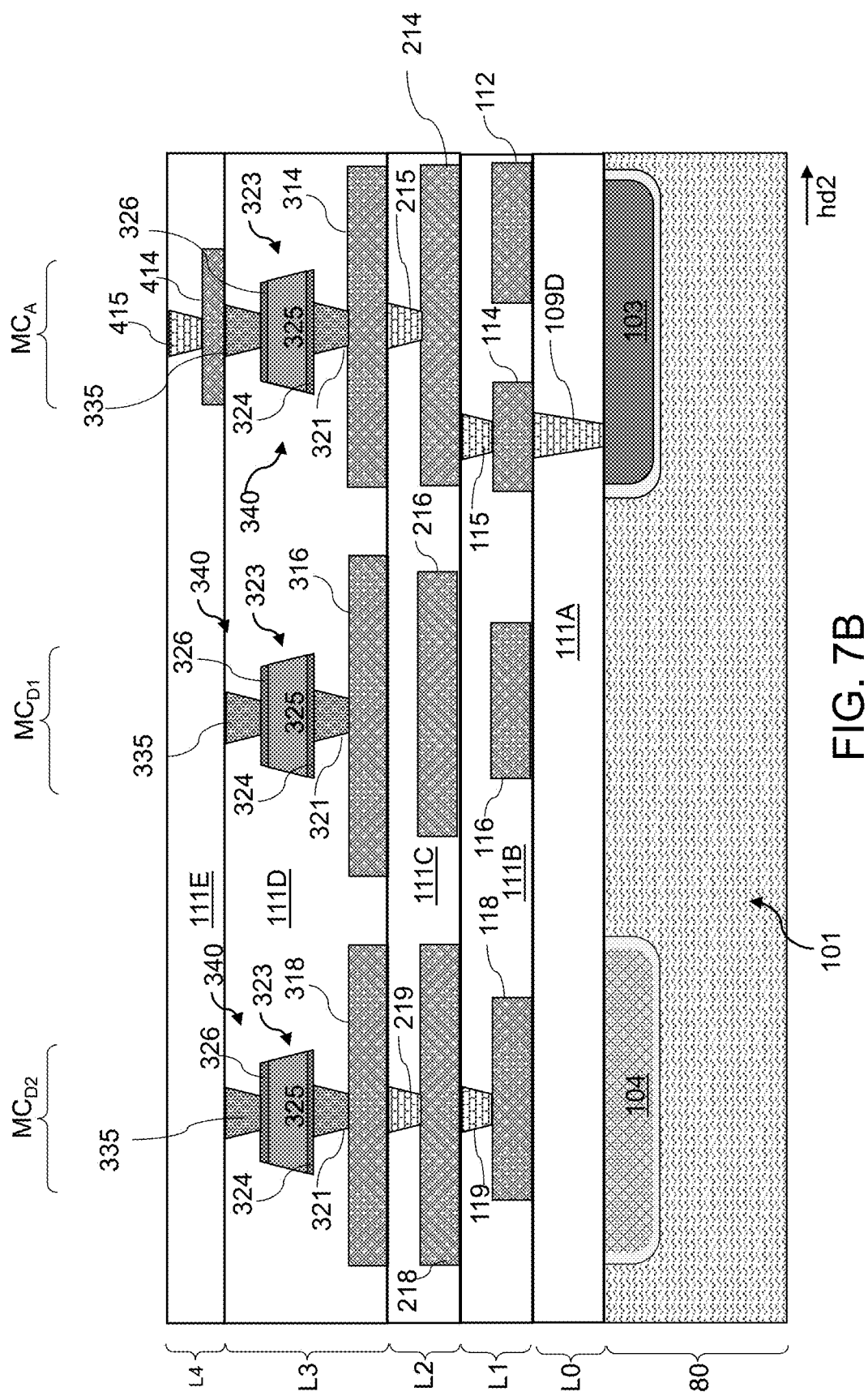
FIG. 7B is a vertical cross-section view of the exemplary intermediate structure along line D-D' in FIG. 7A.

FIG. 7A is a top view of an exemplary intermediate structure during a process of forming a semiconductor IC device illustrating a fourth interconnect-level structure L4 formed over the third interconnect-level structure L3 according to various embodiments of the present disclosure. FIG. 7B is a vertical cross-section view of the exemplary intermediate structure along line D-D' in FIG. 7A.

Referring to FIGS. 7A and 7B, a fifth dielectric material layer 111E, one or more fourth interconnect-level metal lines 414 and one or more fourth interconnect-level metal vias 415 may be formed over the upper surface of the third interconnect-level structure L3. Collectively, the fifth dielectric material layer 111E, the one or more fourth interconnect-level metal lines 414, and the one or more fourth interconnect-level metal vias 415 may be referred to as a fourth interconnect-level structure L4.

The fifth dielectric material layer 111E, the one or more fourth interconnect-level metal lines 414, and the one or more fourth interconnect-level metal vias 415 of the fourth interconnect-level structure L4 may be formed using the same or equivalent processes and materials as described above for forming the second dielectric layer 111B, the first interconnect-level metal lines 112, 114, 116 and 118 and the first interconnect-level metal vias 115, 117 and 119 of the first interconnect-level structure L1. Thus, repeated discussion of like processes and materials is omitted for brevity.

In various embodiments, a plurality of fourth interconnect-level metal lines 414 may extend in a row along the first horizontal direction hd1. The plurality of fourth interconnect-level metal lines 414 may be discontinuous with one another, meaning that each of the fourth interconnect-level metal lines 414 may be laterally surrounded on all sides by the fifth dielectric material layer 111E. Each of the fourth interconnect-level metal lines 414 may overlie and electrically contact an upper contact via 335 of an underlying memory cell 340. A metal via 415 may contact the upper surface of each of the fourth interconnect-level metal lines 414.

Referring again to FIGS. 7A and 7B, fourth interconnect-level metal lines 414 may contact the upper contact vias 325 of active memory cells 340 in each of the rows of active memory cells $MC_A$ within the memory device region(s) 50, 60. The fifth dielectric material layer 111E may cover the upper surfaces of the upper contact vias 325 of the dummy memory cells in each of the rows of dummy memory cells $MC_{D1}$, $MC_{D2}$. Thus, the upper contact vias 325 of the dummy memory cells 340 may be surrounded by the fourth dielectric material layer 111D on lateral side surfaces of the upper contact vias 325 and by the fifth dielectric material layer 111E on the upper surfaces of the upper contact vias 325.

In an alternative embodiment, a single fourth-interconnect level metal line 414 may extend continuously over each the rows of active memory cells $MC_A$ within the memory device region(s) 50, 60. The upper contact vias 325 in the rows of active memory cells $MC_A$ within the memory device region(s) 50, 60 may contact the lower surfaces of the fourth interconnect-level metal line 414. One or more metal vias 415 may contact the upper surface of each of the continuous fourth interconnect-level metal lines 414.

Figure 8A:
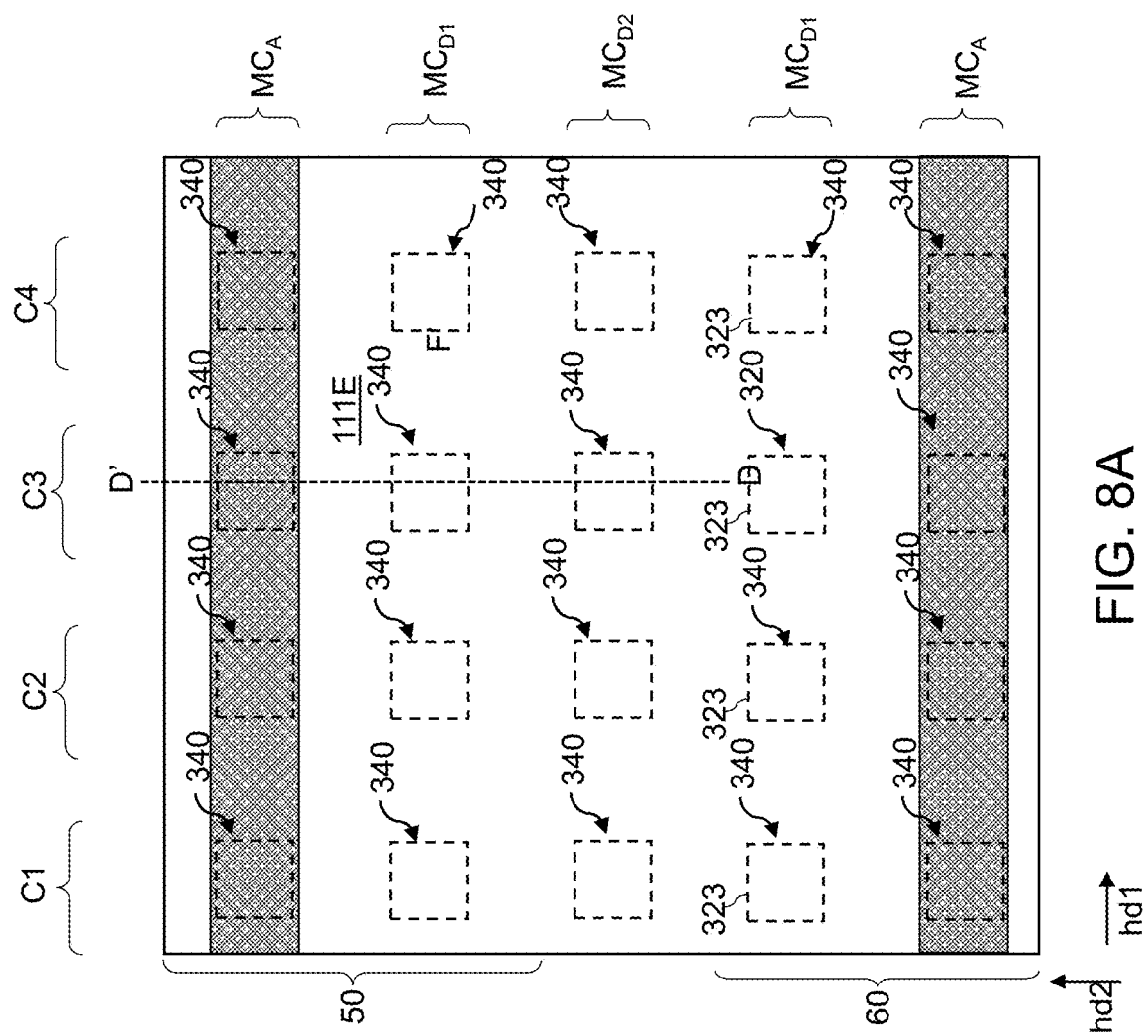
FIG. 8A is a top view of a semiconductor IC device including an array of memory cells illustrating a fifth interconnect-level structure formed over the fourth interconnect-level structure according to various embodiments of the present disclosure.
Figure 8B:
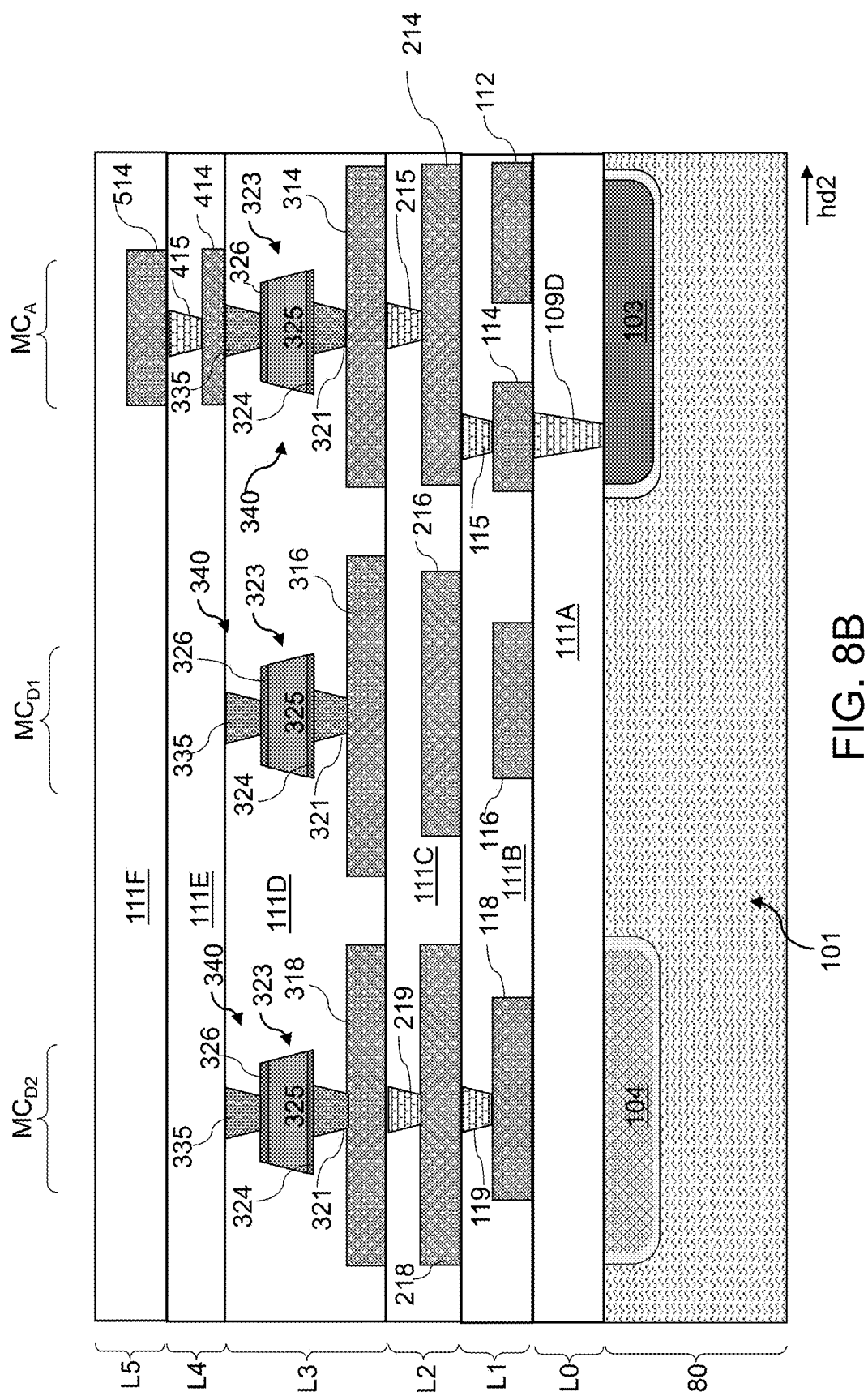
FIG. 8B is a vertical cross-section view of the semiconductor IC device along line D-D' in FIG. 8A.

FIG. 8A is a top view of a semiconductor IC device including an array of memory cells 340 illustrating a fifth interconnect-level structure L5 formed over the fourth interconnect-level structure L4 according to various embodiments of the present disclosure. FIG. 8B is a vertical cross-section view of the semiconductor IC device along line D-D' in FIG. 8A.

Referring to FIGS. 8A and 8B, a sixth dielectric material layer 111F and one or more fifth interconnect-level metal lines 514 may be formed over the upper surface of the fourth interconnect-level structure L4. For clarity of illustration, the sixth dielectric material layer 111F is not shown in the top view of FIG. 8A. Collectively, the sixth dielectric material layer 111F and the one or more fifth interconnect-level metal lines 514 may be referred to as a fifth interconnect-level structure L5. The sixth dielectric material layer 111F and the one or more fifth interconnect-level metal lines 514 may be formed using the same or equivalent processes and materials as described above for forming the second dielectric layer 111B and the first interconnect-level metal lines 112, 114, 116 and 118 of the first interconnect-level structure L1. Thus, repeated discussion of like processes and materials is omitted for brevity.

At least one fifth-interconnect metal line 514 may extend continuously along the first horizontal direction hd1 within the memory device region(s) 50, 60. The metal vias 415 of the fourth interconnect-level structure L4 may each extend between the upper surface of a fourth interconnect-level metal line 414 of the fourth interconnect-level structure L4 and the lower surface of a fifth interconnect-level metal line 514 of the fifth interconnect-level structure L5. Thus, in various embodiments, each fifth interconnect-level metal line 415 may be electrically coupled to the upper contact vias 335 of the active memory cells 340 in a respective row of active memory cells $MC_A$ within the memory device region(s) 50, 60. The fifth interconnect-level metal lines 514 may also be referred to as "bit lines" 415. Each of the fifth interconnect-level metal lines 514 may be surrounded by the sixth dielectric material layer 111F on the lateral sides surfaces and over the upper surface of the fifth-interconnect level metal line 514.

Although the embodiment of FIGS. 8A-8B shows a single fifth interconnect-level metal line 514 within each of the memory device regions 50, 60, it will be understood that a memory device region 50, 60 may include multiple fifth interconnect-level metal lines 514, where each fifth interconnect-level metal line 514 may be electrically coupled to the upper contact vias 335 of a row of active memory cells $MC_A$ of the memory device region 50, 60.

While the present disclosure is described using an embodiment in which an array of memory cells 340 may be formed as a component of a third interconnect-level structure L3, embodiments are expressly contemplated herein in which the array of memory cells 340 may be formed as components of any other interconnect-level structure (e.g., L1-L5). Further, while the present disclosure is described using an embodiment in which a set of five interconnect-level structures are formed, embodiments are expressly contemplated herein in which a different number of interconnect-level structures is used. In addition, embodiments are expressly contemplated herein in which two or more arrays of memory cells 340 cells may be provided within multiple interconnect-level structures in one or more memory device regions 50, 60. While the present disclosure is described using an embodiment in which an array of memory cells 340 may be formed in a single interconnect-level structure, embodiments are expressly contemplated herein in which an array of memory cells 340 may be formed over two vertically adjoining interconnect-level structures. Furthermore, embodiments are expressly contemplated herein in which an array of memory cells 340 may be formed on or within the semiconductor material layer 10 (e.g., in a front-end-of-line (FEOL) operation).

Figure 9:
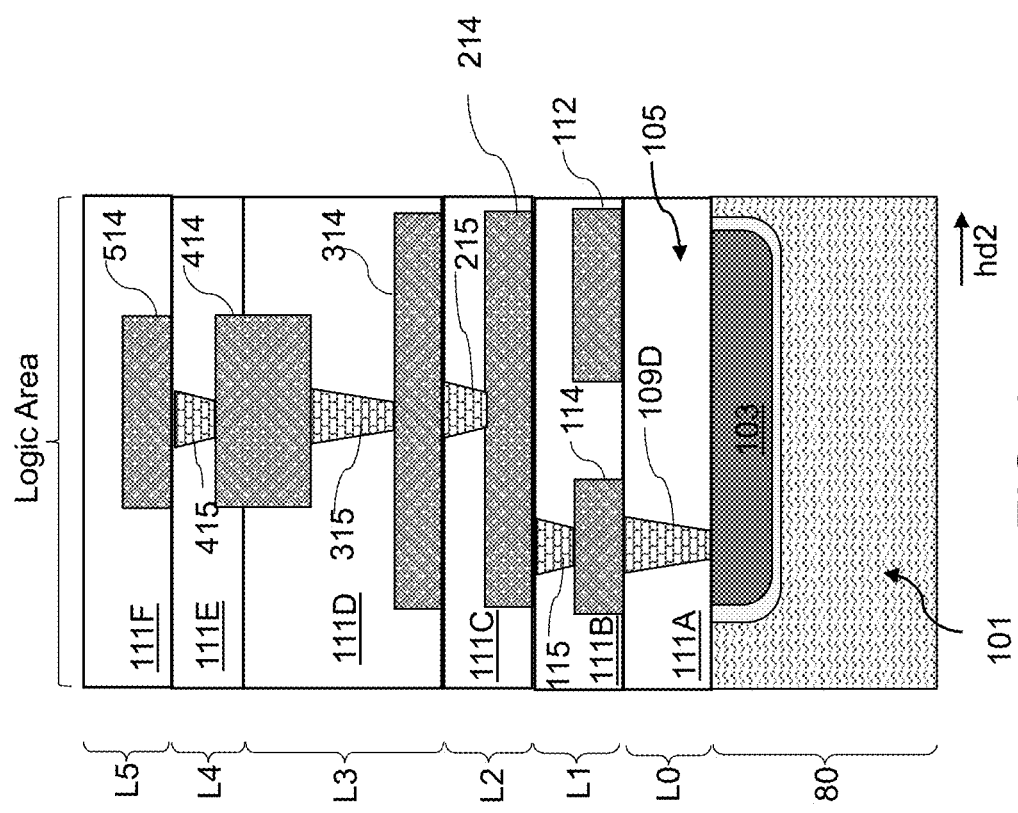
FIG. 9 is a vertical cross-section view of the semiconductor IC device of FIGS. 8A and 8B illustrating a portion of a logic region of the semiconductor IC device according to various embodiments of the present disclosure.

FIG. 9 is a vertical cross-section view of the semiconductor IC device of FIGS. 8A and 8B illustrating a portion of a logic region of the semiconductor IC device according to various embodiments of the present disclosure. Referring to FIG. 9, the logic region of the semiconductor IC device may include semiconductor devices, such as transistors 105, formed on or in a semiconductor material layer 101 of substrate 80, as described above with reference to FIGS. 1A-1E. However, the logic region of the semiconductor IC device may not include memory cells 340 (e.g., it may include only logic circuits). FIG. 9 is a vertical cross-section view through a portion of a logic device (i.e., a transistor 105) including an active region (i.e., drain region 103D) of the logic device. As in the embodiments described above with reference to FIGS. 1A-3E, a contact-level structure L0, a first interconnect-level structure L1, and a second interconnect-level structure L2 may be formed over the logic device(s) within the logic region. The third interconnect-level structure L3 in the logic region may differ from the third interconnect-level structure L3 in the memory device region in that memory cells 340 including memory elements 326 between a lower contact via 321 and an upper contact via 335 may not be present in the third interconnect-level structure L3 within the logic region. Rather, metal vias 315 may be formed within the fourth dielectric material layer 111D, where each metal via 315 may contact an upper surface of a first metal line 314 of the third interconnect-level structure L3. The upper surfaces of the metal vias 315 may be vertically below the planar upper surface of the fourth dielectric material layer 111D as shown in FIG. 9. Each of the fourth interconnect-level metal lines 414 may extend vertically below the planar upper surface of the fourth dielectric material layer 111D such that the lower surface of each fourth interconnect-level metal line 414 may electrically contact an upper surface of one or more metal vias 315 of the third interconnect-level structure L3. Thus, each of the fourth interconnect-level metal lines 414 may include a lower portion that is laterally surrounded by the fourth dielectric material layer 111D of the third interconnect-level structure L3 and an upper portion that is laterally surrounded by the fifth dielectric material layer 111E of the fourth interconnect-level structure L4. The upper surface of each of the fourth interconnect-level metal lines 414 in the logic region of the semiconductor IC device may be substantially co-planar with the fourth interconnect-level metal lines 414 in the memory region(s) 50, 60 of the semiconductor IC device. Accordingly, the combination of the third interconnect-level metal via(s) 315 and the fourth interconnect-level metal lines 414 in the logic region may have substantially the same vertical height as the memory cells 340 and the fourth interconnect-level metal lines 414 in the memory region(s) 50, 60 of the semiconductor IC device.

Referring again to FIG. 9, one or more fourth interconnect-level metal vias 415 may be formed over the upper surface of each of the fourth interconnect-level metal lines 414 in the fourth interconnect-level structure L4 within the logic region, as described above with reference to FIGS. 7A-7B, and a fifth interconnect-level structure L5 including a sixth dielectric material layer 111F and one or more fifth interconnect-level metal lines 514 may be formed over the fourth interconnect-level structure L5 within the logic region of the semiconductor IC device as described above with reference to FIGS. 8A and 8B.

Figure 10:
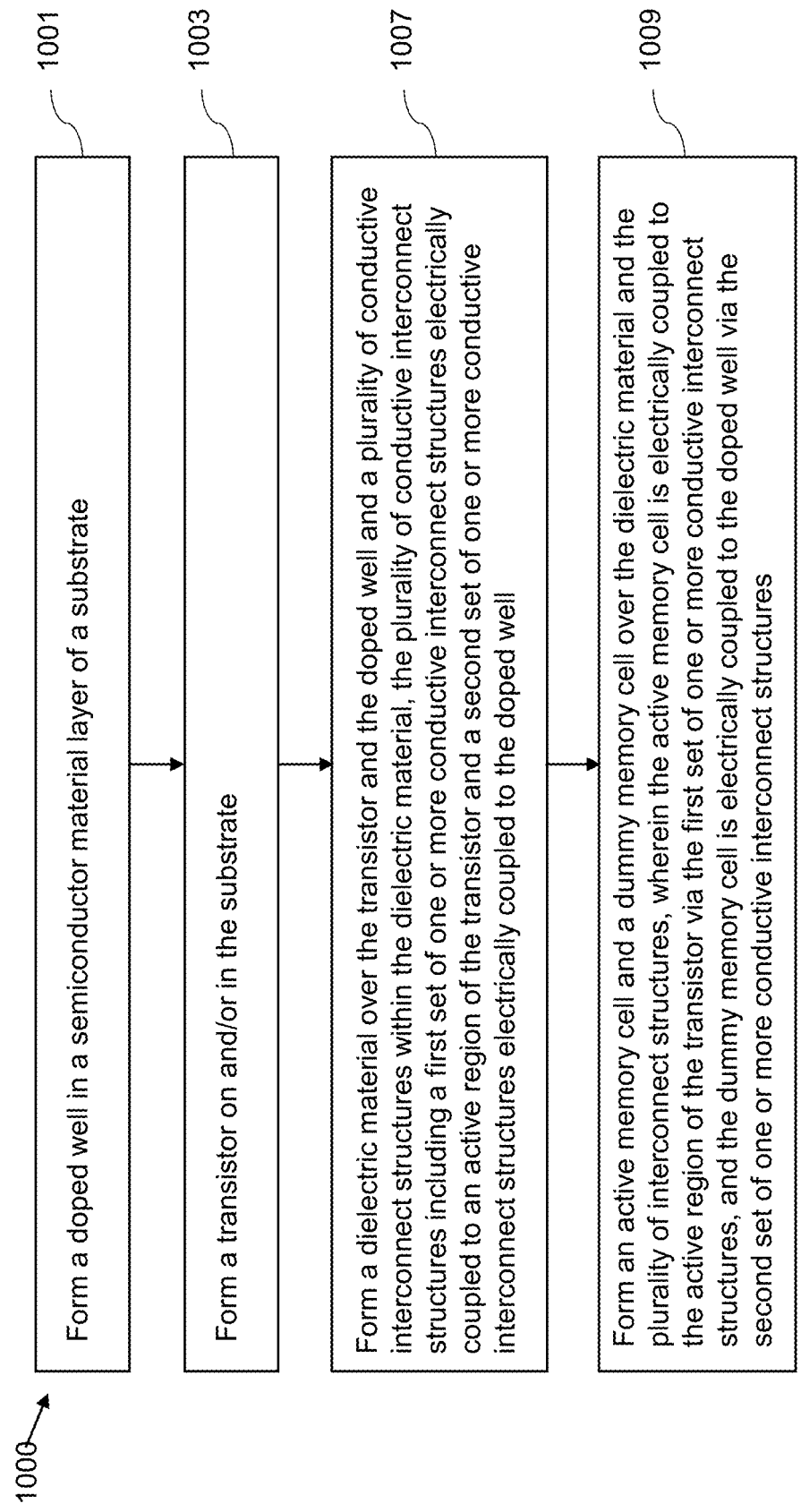
FIG. 10 is a flowchart illustrating a method of fabricating a semiconductor IC device including embedded memory devices according to an embodiment of the present disclosure.

FIG. 10 is a flowchart illustrating a method 1000 of fabricating a semiconductor IC device including embedded memory devices according to an embodiment of the present disclosure. Referring to FIGS. 1A-1E and 10, in step 1001 of method 1000, a doped well 104 may be formed in a semiconductor material layer 101 of a substrate 80. Referring to FIGS. 1A-1E and 10, in step 1003 of method 1000, a transistor 105 may be formed on and/or in the substrate 80. Referring to FIGS. 4A-4D and 10, in step 1007 of method 1000, a dielectric material 111A, 111B, 111C, 111D may be formed over the transistor 105 and the doped well 104 and a plurality of conductive interconnect structures, the plurality of conductive interconnect structures including a first set of one or more conductive interconnect structures 314, 215, 214, 115, 114, 109D electrically coupled to an active region 103D of the transistor 105 and a second set of one or more conductive interconnect structures 318, 219, 218, 119, 118, 109W electrically coupled to the doped well 104. Referring to FIGS. 5A-6D and FIG. 10, in step 1009 of method 1000, an active memory cell $MC_A$ and a dummy memory cell $MC_{D2}$ may be formed over the dielectric material 111A, 111B, 111C, 111D and the plurality of conductive interconnect structures, where the active memory cell $MC_A$ is electrically coupled to the active region 103D of the transistor 105 via the first set of one or more conductive interconnect structures 314, 215, 214, 115, 114, 109D, and the dummy memory cell $MC_{D2}$ is electrically coupled to the doped well 104 via the second set of one or more conductive interconnect structures 318, 219, 218, 119, 118, 109W.

Referring to all drawings and according to various embodiments of the present disclosure, a semiconductor device includes a substrate 80 including a semiconductor material layer 101, a doped well 104 formed in the semiconductor material layer 101 of the substrate 80, a transistor 105 formed on and/or in the substrate 80, a dielectric material 111A, 111B, 111C, 111D located over the doped well 104 and the transistor 105 and including conductive interconnect structures extending through the dielectric material, wherein the conductive interconnect structures include a first set of one or more conductive interconnect structures 314, 215, 214, 115, 114, 109D electrically coupled to an active region 103D of the transistor 105 and a second set of one or more conductive interconnect structures 318, 219, 218, 119, 118, 109W electrically coupled to the doped well 104, an active memory cell 323 contacting the dielectric material 111D and electrically coupled to the active region 103 of the transistor 105 via the first set of one or more conductive interconnect structures 314, 215, 214, 115, 114, 109D, and a dummy memory cell 340 contacting the dielectric material 111D and electrically coupled to the doped well 104 via the second set of one or more conductive interconnect structures 318, 219, 218, 119, 118, 109W.

In one embodiment, the doped well 104 is doped with dopants of a first conductivity type, and the active region 103D includes a portion of the semiconductor material layer 101 of the substrate 80 that is doped with dopants of a second conductivity type that is opposite the first conductivity type.

In another embodiment, the active memory cell $MC_A$ and the dummy memory cell $MC_{D2}$ each include a lower contact via 321 contacting an upper surface of a metal line 314, 318, a memory element 323 contacting an upper surface of the lower contact via 321, and an upper contact via 335 contacting an upper surface of the memory element 323, where the dielectric material 111D laterally surrounds each of the active memory cell $MC_A$ and the dummy memory cell $MC_{D2}$.

In another embodiment, the active memory cell $MC_A$ and the dummy memory cell $MC_{D2}$ each comprise a magnetoresistive random-access memory (MRAM) memory cell, a resistive random-access memory (RRAM) memory cell, a conductive-bridge random-access memory (CBRAM) memory cell, or a ferroelectric random-access memory (FeRAM) memory cell.

In another embodiment, the semiconductor device further includes an additional dummy memory cell $MC_{D1}$ contacting the dielectric material 111D and electrically isolated from the transistor 105 and the substrate 80.

In another embodiment, the additional dummy memory cell $MC_{D1}$ contacts the upper surface of a metal line 316 that is surrounded on its lateral side surfaces and its lower surface by the dielectric material 111C, 111D.

In another embodiment, the additional dummy memory cell $MC_{D1}$ is located between the dummy memory cell $MC_{D2}$ and the active memory cell $MC_A$.

In another embodiment, the conductive interconnect structures comprise a third set of one or more conductive interconnect structures 330, 217, 216, 117, 116, 109G electrically coupled to a gate electrode 108 of the transistor 105, the third set of one or more conductive interconnect structures 330, 217, 216, 117, 116, 109G including a word line 330 extending continuously along one side of the dummy memory cell $MC_{D2}$, the additional dummy memory cell $MC_{D1}$ and the active memory cell $MC_A$ and is separated from the dummy memory cell $MC_{D2}$, the additional dummy memory cell $MC_{D1}$ and the active memory cell $MC_A$ by the dielectric material 111D.

In another embodiment, the transistor 105 includes a first active region 103D that is electrically coupled to the active memory cell $MC_A$ by the first set of one or more conductive interconnect structures 314, 215, 214, 115, 114, 109D, a pair of gate electrodes 108 on either side of the first active region 103D that are electrically coupled to the word line 330 via the third set of one or more conductive interconnect structures 330, 217, 216, 117, 116, 109G, and a pair of second active regions 103S, each of the gate electrodes 108 of the pair of gate electrodes 108 located between the first active region 103D and a respective second active region 103S of the pair of second active regions 103S.

In another embodiment, the conductive interconnect structures further include a source line 112 extending continuously within the dielectric material 111B in a direction perpendicular to the word line 330, the source line 112 electrically coupled to the pair of second active regions 103S of the transistor 105 via a pair of metal contact vias 109S.

Another embodiment is drawn to a semiconductor device including a substrate 80 including a semiconductor material layer 101, a plurality of access transistors 105 formed on and/or in the substrate 80, at least one doped well 104 formed in the semiconductor material layer 101 of the substrate 80 adjacent to the plurality of access transistors 105, a plurality of active memory cells $MC_A$, each active memory cell $MC_A$ electrically coupled to an active region 103D of an access transistor 105 via a first set of one or more conductive interconnect structures 314, 215, 214, 115, 114, 109D, a plurality of first dummy memory cells $MC_{D1}$, each first dummy memory cell $MC_{D1}$ electrically isolated from the substrate 80 and the access transistors 105, and a plurality of second dummy memory cells $MC_{D2}$, each second dummy memory cell $MC_{D2}$ electrically coupled to a doped well 104 via a second set of one or more conductive interconnect structures 318, 219, 218, 119, 118, 109W.

In one embodiment, the semiconductor device further includes a contact-level structure L0 over the substrate 80 and the plurality of access transistors 105 including a first dielectric material layer 111A and a plurality of contact vias 109 within the first dielectric material layer 111A, and one or more interconnect-level structures L1, L2, L3 over the contact-level structure L0, each interconnect-level structure L1, L2, L3 including a dielectric material layer 111B, 111C, 111D and conductive interconnect structures in the dielectric material layer 111B, 111C, 111, wherein the plurality of active memory cells $MC_A$, the plurality of first dummy memory cells $MC_{D1}$ and the plurality of second dummy memory cells $MC_{D2}$ are located within an interconnect-level structure L3 and are laterally-surrounded by a dielectric material layer 111D.

In another embodiment, the contact-level structure L0 includes a plurality of first contact vias 109S electrically contacting respective first active regions 103S of the access transistors 105, a plurality of second contact vias 109D structures electrically contacting respective second active regions 103D of the access transistors 105, a plurality of third contact vias 109G electrically contacting respective gate electrodes 108 of the access transistors 105, and a plurality of fourth contact vias 109W electrically contacting a doped well 104, and the one or more interconnect-level structures L1, L2, L3 include a first interconnect-level structure L1 over the contact-level structure L0, the first interconnect-level structure L1 including a second dielectric material layer 111B, a first metal line 112 extending continuously along a first horizontal direction hd1 and electrically contacting each of the first contact vias 109S of the contact-level structure L0, a plurality of second metal lines 114 and metal vias 115 contacting an upper surface of each of the second metal lines 114, each of the second metal lines 114 electrically contacting a second contact via 109D of the contact-level structure L0, a plurality of third metal lines 116 and metal vias 117 contacting an upper surface of each of the third metal lines 116, each of the third metal lines 116 electrically contacting a pair of third contact vias 109G of the contact-level structure L0, and a fourth metal line 118 extending continuously along the first horizontal direction hd1 and electrically contacting each of the fourth contact vias 109W of the contact-level structure L0.

In another embodiment, the one or more interconnect-level structures L1, L2, L3 includes a second interconnect-level structure L2 over the first interconnect-level structure L1, the second interconnect-level structure L2 including a third dielectric material layer 111C, a plurality of first metal lines 214, each of the first metal lines 214 of the second interconnect-level structure L2 electrically coupled to a second metal line 114 of the first interconnect-level structure L1 by a metal via 115 of the first-interconnect structure L1, a plurality of second metal lines 216, each of the second metal lines 216 including a strip-shaped portion 221 extending continuously along a second horizontal direction hd2 that is perpendicular to the first horizontal direction hd1 and at least one protruding portion 220 that protrudes from a side of the strip-shaped portion 221 along the first horizontal direction hd1, each of the protruding portions 220 of the second metal lines 216 of the second interconnect-level structure L2 electrically coupled to a third metal line 116 of the first interconnect-level structure L1 by a metal via 117 of the first interconnect-level structure L1, a plurality of third metal lines 218, each of the third metal lines 218 of the second interconnect-level structure L2 electrically coupled to a fourth metal line 118 of the first interconnect-level structure L1 by a metal via 119 of the first-interconnect structure L1, and the second interconnect structure L2 further includes a plurality of metal vias 215, 217, 219, wherein at least one metal via 215, 217, 219 contacts an upper surface of each of the first metal lines 214, the strip-shaped portion 221 of the second metal lines 216, and the third metal lines 218 of the second interconnect-level structure L2.

In another embodiment, the one or more interconnect-level structures L1, L2, L3 includes a third interconnect-level structure L3 over the second interconnect-level structure L2, the third interconnect-level structure L3 including a fourth dielectric material layer 111D, a plurality of first metal lines 314, each of the first metal lines 314 of the third interconnect-level structure L3 electrically coupled to a first metal line 214 of the second interconnect-level structure L2 by a metal via 215 of the second-interconnect structure L2, a plurality of second metal lines 316, each of the second metal lines 316 of the third interconnect-level structure L3 at least partially overlying a protruding portion 220 of a second metal line 216 of the second interconnect-level structure L2, a plurality of third metal lines 318, each of the third metal lines 318 of the third interconnect-level structure L3 electrically coupled to a third metal line 218 of the second interconnect-level structure L2 by a metal via 219 of the second-interconnect structure L2, a plurality of fourth metal lines 330 extending continuously along the second horizontal direction hd2, each of the fourth metal lines 330 of the third interconnect-level structure L3 electrically coupled to a strip-shaped portion 221 of a second metal line 216 of the second interconnect-level structure L2 by at least one metal via 217 of the second interconnect-level structure L2.

In another embodiment, each of the active memory cells $MC_A$ includes a lower contact via 321 contacting the upper surface of a first metal line 314 of the third interconnect-level structure L3, a memory element 323 over the lower contact via 321, and an upper contact via 335 over the memory element 323, each of the first dummy memory cells $MC_{D1}$ includes a lower contact via 321 contacting the upper surface of a second metal line 316 of the third interconnect-level structure L3, a memory element 323 over the lower contact via 321, and an upper contact via 335 over the memory element 323, and each of the second dummy memory cells $MC_{D2}$ includes a lower contact via 321 contacting the upper surface of a third metal line 318 of the third interconnect-level structure L3, a memory element 323 over the lower contact via 321, and an upper contact via 335 over the memory element 323.

Another embodiment is drawn to a method of fabricating a semiconductor device that includes forming a doped well 104 in a semiconductor material layer 101 of a substrate 80, forming a transistor 105 on and/or in the substrate 80, forming a dielectric material 111A, 111B, 111C, 111D over the transistor 105 and the doped well 104 and a plurality of conductive interconnect structures within the dielectric material, the plurality of interconnect structures including a first set of one or more conductive interconnect structures 314, 215, 214, 115, 114, 109D electrically coupled to an active region 103D of the transistor 105 and a second set of one or more conductive interconnect structures 318, 219, 218, 119, 118, 109W electrically coupled to the doped well 104, and forming an active memory cell $MC_A$ and a dummy memory cell $MC_{D2}$ over the dielectric material and the plurality of conductive interconnect structures, where the active memory cell $MC_A$ is electrically coupled to the active region 103D of the transistor 105 via the first set of one or more conductive interconnect structures 314, 215, 214, 115, 114, 109D, and the dummy memory cell $MC_{D2}$ is electrically coupled to the doped well 104 via the second set of one or more conductive interconnect structures 318, 219, 218, 119, 118, 109W.

In one embodiment, the method further includes forming an additional dummy memory cell $MC_{D1}$ over the dielectric material and the plurality of interconnect structures, wherein the additional dummy memory cell $MC_{D1}$ is electrically isolated from the transistor 105 and the substrate 80.

In another embodiment, forming the active memory cell $MC_A$, the dummy memory cell $MC_{D2}$, and the additional dummy memory cell $MC_{D1}$ includes etching the dielectric material 111D through a patterned mask to form a plurality of via openings in the dielectric material 111D, depositing a conductive material within the via openings to form a plurality of lower contact vias 321, depositing a continuous bottom electrode layer 324 over the dielectric material 111D and the plurality of lower contact vias 321, depositing a continuous memory material layer 325 over the continuous bottom electrode layer 324, depositing a continuous top electrode layer 326 over the continuous memory material layer 325, etching the continuous top electrode layer 326, the continuous memory material layer 325, and the continuous bottom electrode layer 324 to form a plurality of discrete memory elements 323 contacting respective lower contact vias 321, depositing additional dielectric material 111A over the side surfaces and upper surfaces of the discrete memory elements 323, etching the additional dielectric material 111D through a patterned mask to form a plurality of via openings in the additional dielectric material 111D, and depositing a conductive material within the via openings to form a plurality of upper contact vias 335 contacting each of the discrete memory elements 323.

In another embodiment, at least one of the deposition steps and/or the etching steps used to form the active memory cell $MC_A$, the dummy memory cell $MC_{D2}$, and the additional dummy memory cell $MC_{D1}$ includes a plasma-assisted deposition and/or etching process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate comprising a semiconductor material layer;
a doped well formed in the semiconductor material layer of the substrate;
a transistor formed on the substrate;
a dielectric material located over the doped well and the transistor and including conductive interconnect structures extending through the dielectric material, wherein the conductive interconnect structures comprise a first set of one or more conductive interconnect structures electrically coupled to an active region of the transistor and a second set of one or more conductive interconnect structures electrically coupled to the doped well;
an active memory cell contacting the dielectric material and electrically coupled to the active region of the transistor via the first set of one or more conductive interconnect structures; and
a dummy memory cell contacting the dielectric material and electrically coupled to the doped well via the second set of one or more conductive interconnect structures.

2. The semiconductor device of claim 1, wherein the doped well is doped with dopants of a first conductivity type, and the active region comprises a portion of the semiconductor material layer of the substrate that is doped with dopants of a second conductivity type that is opposite the first conductivity type.

3. The semiconductor device of claim 2, wherein the active memory cell and the dummy memory cell each comprise:
a lower contact via contacting an upper surface of a metal line;
a memory element contacting an upper surface of the lower contact via; and
an upper contact via contacting an upper surface of the memory element, wherein the dielectric material laterally surrounds each of the active memory cell and the dummy memory cell.

4. The semiconductor device of claim 1, wherein the active memory cell and the dummy memory cell each comprise a magnetoresistive random-access memory (MRAM) memory cell, a resistive random-access memory (RRAM) memory cell, a conductive-bridge random-access memory (CBRAM) memory cell, or a ferroelectric random-access memory (FeRAM) memory cell.

5. The semiconductor device of claim 1, further comprising:
an additional dummy memory cell contacting the dielectric material and electrically isolated from the transistor and the substrate.

6. The semiconductor device of claim 5, wherein the additional dummy memory cell contacts an upper surface of a metal line that is surrounded on its lateral side surfaces and its lower surface by the dielectric material.

7. The semiconductor device of claim 5, wherein the additional dummy memory cell is located between the dummy memory cell and the active memory cell.

8. The semiconductor device of claim 7, wherein the conductive interconnect structures comprise a third set of one or more conductive interconnect structures electrically coupled to a gate electrode of the transistor, the third set of one or more conductive interconnect structures comprising a word line extending continuously along one side of the dummy memory cell, the additional dummy memory cell and the active memory cell and is separated from the dummy memory cell, the additional dummy memory cell and the active memory cell by the dielectric material.

9. The semiconductor device of claim 8, wherein the transistor comprises:
a first active region that is electrically coupled to the active memory cell by the first set of one or more conductive interconnect structures;
a pair of gate electrodes on either side of the first active region that are electrically coupled to the word line via the third set of one or more conductive interconnect structures; and
a pair of second active regions, each of the gate electrodes of the pair of gate electrodes located between the first active region and a respective second active region of the pair of second active regions.

10. The semiconductor device of claim 9, wherein the conductive interconnect structures further comprise a source line extending continuously within the dielectric material in a direction perpendicular to the word line, the source line electrically coupled to the pair of second active regions of the transistor via a pair of metal contact vias.

11. A semiconductor device, comprising:
a substrate comprising a semiconductor material layer;
a plurality of access transistors formed on the substrate;
at least one doped well formed in the semiconductor material layer of the substrate adjacent to the plurality of access transistors;
a plurality of active memory cells, each active memory cell electrically coupled to an active region of an access transistor via a first set of one or more conductive interconnect structures;
a plurality of first dummy memory cells, each first dummy memory cell electrically isolated from the substrate and the access transistors; and
a plurality of second dummy memory cells, each second dummy memory cell electrically coupled to a doped well via a second set of one or more conductive interconnect structures.

12. The semiconductor device of claim 11, further comprising:
a contact-level structure over the substrate and the plurality of access transistors comprising a first dielectric material layer and a plurality of contact vias within the first dielectric material layer; and
one or more interconnect-level structures over the contact-level structure, each interconnect-level structure comprising:
a dielectric material layer; and
conductive interconnect structures in the dielectric material layer, wherein the plurality of active memory cells, the plurality of first dummy memory cells and the plurality of second dummy memory cells are located within an interconnect-level structure and are laterally-surrounded by a dielectric material layer.

13. The semiconductor device of claim 12, wherein the contact-level structure comprises:
    a plurality of first contact vias electrically contacting respective first active regions of the access transistors;
    a plurality of second contact vias structures electrically contacting respective second active regions of the access transistors;
    a plurality of third contact vias electrically contacting respective gate electrodes of the access transistors; and
    a plurality of fourth contact vias electrically contacting a doped well, and the one or more interconnect-level structures comprises a first interconnect-level structure over the contact-level structure, the first interconnect-level structure comprising:
        a second dielectric material layer;
        a first metal line extending continuously along a first horizontal direction and electrically contacting each of the first contact vias of the contact-level structure;
        a plurality of second metal lines and metal vias contacting an upper surface of each of the second metal lines, each of the second metal lines electrically contacting a second contact via of the contact-level structure;
        a plurality of third metal lines and metal vias contacting an upper surface of each of the third metal lines, each of the third metal lines electrically contacting a pair of third contact vias of the contact-level structure; and
        a fourth metal line extending continuously along the first horizontal direction and electrically contacting each of the fourth contact vias of the contact-level structure.

14. The semiconductor device of claim 13, wherein the one or more interconnect-level structures comprises a second interconnect-level structure over the first interconnect-level structure, the second interconnect-level structure comprising:
    a third dielectric material layer;
    a plurality of first metal lines, each of the first metal lines of the second interconnect-level structure electrically coupled to a second metal line of the first interconnect-level structure by a metal via of the first-interconnect structure;
    a plurality of second metal lines, each of the second metal lines comprising a strip-shaped portion extending continuously along a second horizontal direction that is perpendicular to the first horizontal direction and at least one protruding portion that protrudes from a side of the strip-shaped portion along the first horizontal direction, each of the protruding portions of the second metal lines of the second interconnect-level structure electrically coupled to a third metal line of the first interconnect-level structure by a metal via of the first interconnect-level structure; and
    a plurality of third metal lines, each of the third metal lines of the second interconnect-level structure electrically coupled to a fourth metal line of the first interconnect-level structure by a metal via of the first-interconnect structure, and the second interconnect-level structure further comprises a plurality of metal vias, wherein at least one of the metal vias contacts an upper surface of each of the first metal lines, the strip-shaped portion of the second metal lines, and the third metal lines of the second interconnect-level structure.

15. The semiconductor device of claim 14, wherein the one or more interconnect-level structures comprises:
    a third interconnect-level structure over the second interconnect-level structure, the third interconnect-level structure comprising:
        a fourth dielectric material layer;
        a plurality of first metal lines, each of the first metal lines of the third interconnect-level structure electrically coupled to a first metal line of the second interconnect-level structure by a metal via of the second-interconnect structure;
        a plurality of second metal lines, each of the second metal lines of the third interconnect-level structure at least partially overlying a protruding portion of a second metal line of the second interconnect-level structure;
        a plurality of third metal lines, each of the third metal lines of the third interconnect-level structure electrically coupled to a third metal line of the second interconnect-level structure by a metal via of the second-interconnect structure; and
        a plurality of fourth metal lines extending continuously along the second horizontal direction, each of the fourth metal lines of the third interconnect-level structure electrically coupled to a strip-shaped portion of a second metal line of the second interconnect-level structure by at least one metal via of the second interconnect-level structure.

16. The semiconductor device of claim 15, wherein:
    each of the active memory cells comprises a lower contact via contacting the upper surface of a first metal line of the third interconnect-level structure, a memory element over the lower contact via, and an upper contact via over the memory element;
    each of the first dummy memory cells comprises a lower contact via contacting the upper surface of a second metal line of the third interconnect-level structure, a memory element over the lower contact via, and an upper contact via over the memory element; and
    each of the second dummy memory cells comprises a lower contact via contacting the upper surface of a third metal line of the third interconnect-level structure, a memory element over the lower contact via, and an upper contact via over the memory element.

17. A method of fabricating a semiconductor device, comprising:
    forming a doped well in a semiconductor material layer of a substrate;
    forming a transistor on the substrate;
    forming a dielectric material over the transistor and the doped well and a plurality of conductive interconnect structures within the dielectric material, the plurality of interconnect structures including a first set of one or more conductive interconnect structures electrically coupled to an active region of the transistor and a second set of one or more conductive interconnect structures electrically coupled to the doped well; and
    forming an active memory cell and a dummy memory cell over the dielectric material and the plurality of conductive interconnect structures, wherein the active memory cell is electrically coupled to the active region of the transistor via the first set of one or more conductive interconnect structures, and the dummy memory cell is electrically coupled to the doped well via the second set of one or more conductive interconnect structures.

18. The method of claim 17, further comprising forming an additional dummy memory cell over the dielectric material and the plurality of interconnect structures, wherein the additional dummy memory cell is electrically isolated from the transistor and the substrate.

19. The method of claim 18, wherein forming the active memory cell, the dummy memory cell and the additional dummy memory cell comprises:
    etching the dielectric material through a patterned mask to form a plurality of via openings in the dielectric material;
    depositing a conductive material within the via openings to form a plurality of lower contact vias;
    depositing a continuous bottom electrode layer over the dielectric material and the plurality of lower contact vias;
    depositing a continuous memory material layer over the continuous bottom electrode layer;
    depositing a continuous top electrode layer over the continuous memory material layer;
    etching the continuous top electrode layer, the continuous memory material layer, and the continuous bottom electrode layer to form a plurality of discrete memory elements contacting respective lower contact vias;
    depositing additional dielectric material over side surfaces and upper surfaces of the discrete memory elements;
    etching the additional dielectric material through a patterned mask to form a plurality of via openings in the additional dielectric material; and
    depositing a conductive material within the via openings to form a plurality of upper contact vias contacting each of the discrete memory elements.

20. The method of claim 19, wherein at least one of the deposition steps or the etching steps used to form the active memory cell, the dummy memory cell and the additional dummy memory cell comprises a plasma-assisted deposition or etching process.

* * * * *